(12) United States Patent
Takenaka

(10) Patent No.: US 12,224,010 B2
(45) Date of Patent: Feb. 11, 2025

(54) NON-VOLATILE MEMORY

(71) Applicant: ROHM CO., LTD., Kyoto (JP)

(72) Inventor: Seiji Takenaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 199 days.

(21) Appl. No.: 18/021,606

(22) PCT Filed: Aug. 5, 2021

(86) PCT No.: PCT/JP2021/029134
§ 371 (c)(1),
(2) Date: Feb. 16, 2023

(87) PCT Pub. No.: WO2022/059378
PCT Pub. Date: Mar. 24, 2022

(65) Prior Publication Data
US 2023/0307049 A1    Sep. 28, 2023

(30) Foreign Application Priority Data

Sep. 18, 2020 (JP) ................ 2020-156967

(51) Int. Cl.
| | | |
|---|---|---|
| G11C 16/04 | (2006.01) | |
| G11C 16/10 | (2006.01) | |
| G11C 16/26 | (2006.01) | |

(52) U.S. Cl.
CPC .......... *G11C 16/0441* (2013.01); *G11C 16/10* (2013.01); *G11C 16/26* (2013.01)

(58) Field of Classification Search
None
See application file for complete search history.

(56) References Cited

U.S. PATENT DOCUMENTS

| | | | |
|---|---|---|---|
| 10,468,104 B1 | 11/2019 | Anand et al. | |
| 2011/0063924 A1 | 3/2011 | Luo et al. | |
| 2012/0044741 A1* | 2/2012 | Takaoka ................ | G11C 17/18 |
| | | | 257/E21.409 |
| 2015/0138891 A1 | 5/2015 | Iyer et al. | |

(Continued)

FOREIGN PATENT DOCUMENTS

| | | |
|---|---|---|
| DE | 102019206854 | 12/2019 |
| DE | 102019116876 | 1/2020 |

(Continued)

OTHER PUBLICATIONS

International Search Report in International Appln No. PCT/JP2021/029134 dated Sep. 14, 2021, 6 pages.

*Primary Examiner* — Tan T. Nguyen
(74) *Attorney, Agent, or Firm* — Fish & Richardson P.C.

(57) ABSTRACT

A non-volatile memory has: a first and a second transistor having their gates connected together; a resistor having a first and a second terminal, with the first terminal connected to the source of the first transistor; a read voltage feed circuit configured to feed a read voltage for turning on at least one of the first and second transistors to between the gate of the first transistor and the second terminal of the resistor and to between the gate and the source of the second transistor; and a signal output circuit configured to output, in a read operation in which the read voltage feed circuit feeds the read voltage, a signal associated with a first or second value based on the drain currents of the first and second transistors.

10 Claims, 18 Drawing Sheets

(56) References Cited

U.S. PATENT DOCUMENTS

2020/0005846 A1    1/2020   Liu et al.
2021/0082485 A1    3/2021   Liu et al.
2022/0068342 A1    3/2022   Liu et al.

FOREIGN PATENT DOCUMENTS

JP      2006277799     10/2006
JP      2011103158      5/2011

\* cited by examiner

READ OPERATION (RD_PRG) AFTER PROGRAM OPERATION

NON-VOLATILE MEMORY

CROSS REFERENCE TO RELATED APPLICATIONS

This application is a U.S. National Phase application under 35 U.S.C. § 371 of International Patent Application No. PCT/JP2021/029134, filed on Aug. 5, 2021, which claims the priority of Japanese Patent Application No. 2020-156967, filed on Sep. 18, 2020, the disclosure of which is incorporated herein by reference in its entirety.

TECHNICAL FIELD

The present disclosure relates to non-volatile memories.

BACKGROUND ART

Non-volatile memories that exploit hot carrier injection into transistors are known. A non-volatile memory of this type includes, as memory elements, a first and a second transistor (corresponding to m1 and m2 in FIG. 22) with paired characteristics in their initial state, and hot carriers are injected into only one of those transistors to degrade its characteristics. In a read operation thereafter, based on the magnitude relationship between the drain currents of the first and second transistors observed when they are fed with a common gate voltage, whether data corresponding to "1" or data corresponding to "1" is stored in them is read out. For example, a state where the drain current of the first transistor is lower (a state where the first transistor is degraded) corresponds to a state where data of "0" is stored, and a state where the drain current of the second transistor is lower (a state where the second transistor is degraded) corresponds to a state where data of "1" is stored.

Note that, in the non-volatile memory described above, the data stored in the initial state is indefinite. To avoid indefiniteness in the data stored in the initial state, some known non-volatile memories are configured such that a higher current passes through one of the first and second transistors in the initial state.

CITATION LIST

Patent Literature

Patent Document 1: JP-A-2011-103158

SUMMARY OF DISCLOSURE

Technical Problem

For reduction of the size of a circuit as a whole, memory elements (first and second transistors) are often required to be reduced in size. Reducing the size of memory elements leads to a larger mismatch between the memory elements. A plurality of transistors formed with an intention to give them paired characteristics may actually have greatly varying characteristics, resulting in a mismatch. Such a mismatch causes inconveniences, such as by impairing proper storing and reading of data (this will be discussed in detail later). Expectation is high for non-volatile memories that are less liable to be affected by a mismatch.

An object of the present disclosure is to provide a non-volatile memory that is less liable to be affected by a mismatch.

Solution to Problem

According to one aspect of the present disclosure, a non-volatile memory includes: a first transistor; a second transistor having its gate connected to the gate of the first transistor; a resistor having a first terminal and a second terminal, with the first terminal connected to the source of the first transistor; a read voltage feed circuit configured to feed a read voltage for turning on at least one of the first and second transistors to between the gate of the first transistor and the second terminal of the resistor and to between the gate and the source of the second transistor; and a signal output circuit configured to output, in a read operation in which the read voltage feed circuit feeds the read voltage, a signal associated with a first value or a signal associated with a second value based on the drain currents of the first and second transistors.

According to another aspect of the present disclosure, a non-volatile memory includes: a first transistor; a second transistor having its gate connected to the gate of the first transistor; a resistor having a first terminal and a second terminal, with the first terminal connected to a source of the first transistor; a read voltage feed circuit configured to be able to feed a read voltage for turning on at least one of the first and second transistors; and a signal output circuit configured to be able to output, in a read operation in which the read voltage feed circuit feeds the read voltage, a signal associated with a first value or a signal associated with a second value based on the drain currents of the first and second transistors.

Advantageous Effects of Disclosure

According to the present disclosure, it is possible to provide a non-volatile memory that is less liable to be affected by a mismatch.

DESCRIPTION OF EMBODIMENTS

Figure 1:
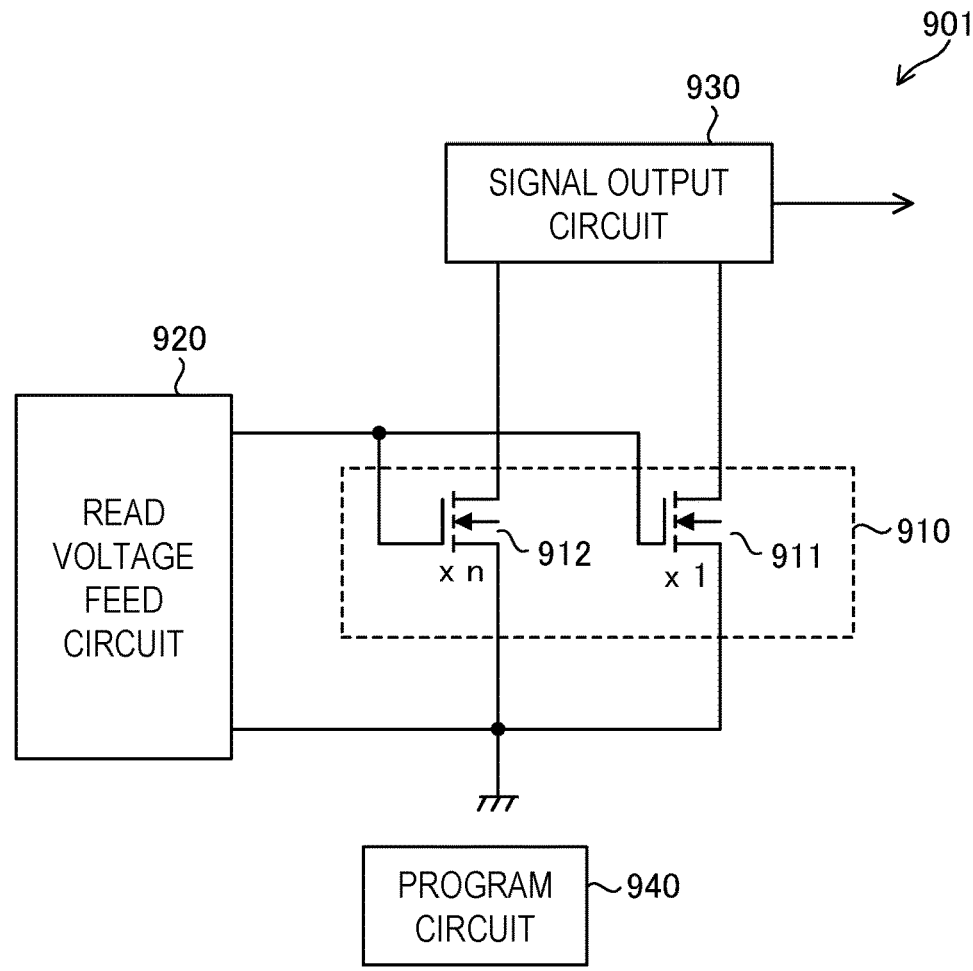
FIG. 1 is a configuration diagram of a storage circuit according to the basic embodiment of the present disclosure.

Hereinafter, examples of implementing the present disclosure will be described specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the read voltage feed circuit described later and identified by the reference sign "20" (see FIG. 4) is sometimes referred to as the read voltage feed circuit 20 and other times abbreviated to the circuit 20, both referring to the same entity.

First, some of the terms used to describe embodiments of the present disclosure will be defined. "Ground" refers to a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground. "Level" denotes the level of a potential, and for any signal or voltage of interest, "high level" has a higher potential than "low level". For any signal or voltage of interest, its being at high level means its level being equal to high level, and its being at low level means its level being equal to low level. A level of a signal is occasionally referred to as a signal level, and a level of a voltage is occasionally referred to as a voltage level.

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply for any transistor that is not classified as an FET. Unless otherwise stated, any MOSFET can be understood to be an enhancement MOSFET. "MOSFET" is an abbreviation of "metal-oxide-semiconductor field-effect transistor".

The electrical characteristics of a MOSFET include the gate threshold voltage. For any transistor that is an N-channel enhancement MOSFET, when the gate potential of the transistor is higher than the source potential of the transistor and the magnitude of the gate-source voltage (the gate potential relative to the source potential) of the transistor is equal to or higher than the gate threshold voltage of the transistor, the transistor is in the on state; otherwise, the transistor is in the off state. For any transistor that is a P-channel enhancement MOSFET, when the gate potential of the transistor is lower than the source potential of the transistor and the magnitude of the gate-source voltage (the gate potential relative to the source potential) of the transistor is equal to or higher than the gate threshold voltage of the transistor, the transistor is in the on state; otherwise, the transistor is in the off state.

Any switch can be configured with one or more FETs (field-effect transistors). When a given switch is in the on state, the switch conducts across its terminals; when a given switch is in the off state, the switch does not conduct across its terminals. For any transistor or switch, its being in the on or off state is occasionally expressed simply as its being on or off respectively.

For any signal that takes as its signal level high level or low level, the period in which the signal is at high level is referred to as the high-level period and the period in which the signal is at low level is referred to as the low-level period. The same applies to any voltage that takes as its voltage level high level or low level.

Basic Embodiment

A basic embodiment of the present disclosure will be described. FIG. 1 is a configuration diagram showing a principal part of a storage circuit 901 according to the basic embodiment. The storage circuit 901 is a non-volatile memory that stores one-bit data, and includes a memory segment 910, a read voltage feed circuit 920, a signal output circuit 930, and a program circuit 940. The storage circuit 901 can be configured as a semiconductor integrated circuit.

Figure 2:
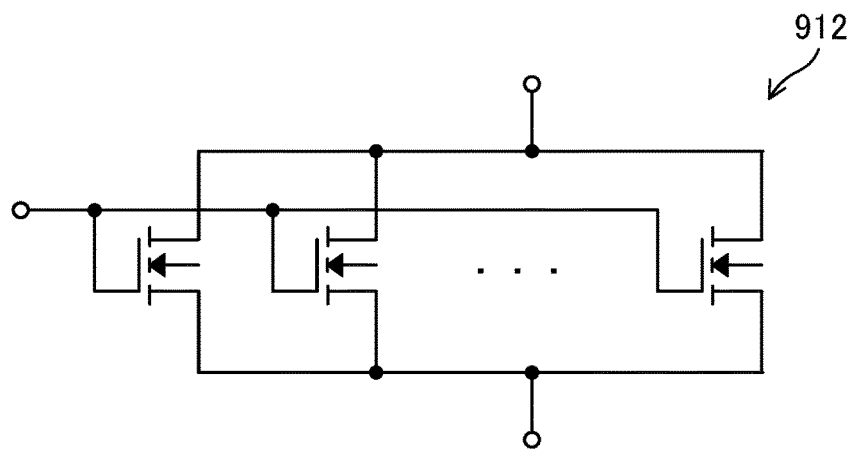
FIG. 2 is a diagram showing how a transistor (MOSFET) illustrated as a single element in FIG. 1 is composed of a parallel circuit of a plurality of unit MOSFETs.

The memory segment 910 includes memory elements 911 and 912, and the memory segment 910 stores data of "0" or data of "1". The memory elements 911 and 912 are each a transistor. Accordingly, the memory elements 911 and 912 are referred to also as transistors 911 and 912. The transistors 911 and 912 are each configured as an N-channel MOSFET. While the transistor 911 is formed as a single unit MOSFET, the transistor 912 is formed as a parallel circuit of n unit MOSFETs as shown in FIG. 2. Here, n is any integer of two or more. The unit MOSFET that constitutes the transistor 911 and the unit MOSFETs that constitute the transistor 912 all have the same structure and, before a program operation by the program circuit 940, all have the same electrical characteristics (including gate threshold voltage).

The gates of the transistors 911 and 912 are connected together. The sources of the transistors 911 and 912 are connected to a ground. The drains of the transistors 911 and 912 are connected to the signal output circuit 930.

The storage circuit 901 can perform a read operation to read the data stored in the memory segment 910 and a program operation (write operation) to rewrite the data stored in the memory segment 910 from "0" to "1".

The read voltage feed circuit 920 is a circuit that functions effectively in a read operation; in a read operation, it feeds the gates of the transistors 911 and 912 with a read voltage for turning on at least one of the transistors 911 and 912. The read voltage is higher at least than the gate threshold voltage of the transistor 911. In a read operation, the signal output circuit 930 outputs a signal corresponding to the value of the data stored in the memory segment 910 based on the magnitude relationship between the drain currents of the transistors 911 and 912.

A program operation is carried out by the program circuit 940. In a program operation, the program circuit 940 injects hot carriers into the transistor 912 to degrade its electrical characteristics, and thereby increases (raises) the gate threshold voltage of the transistor 912.

Figure 3:
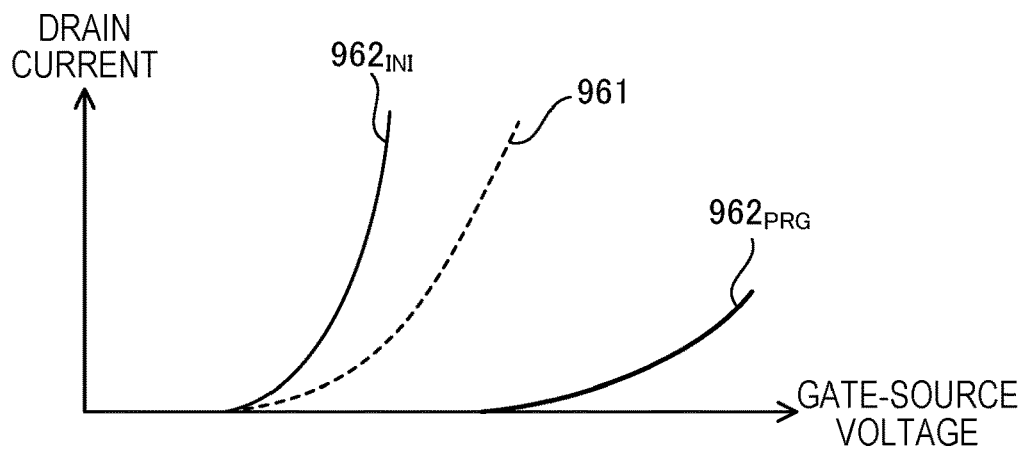
FIG. 3 is a diagram showing the characteristics of each transistor in FIG. 1.

Refer to FIG. 3. In FIG. 3, the solid-line waveform $962_{INI}$ represents the gate-source voltage dependence of the drain current of the transistor 912 before a program operation (i.e., with the storage circuit 901 in the initial state), and the solid-line waveform $962_{PRG}$ represents the gate-source voltage dependence of the drain current of the transistor 912 after a program operation. The broken-line waveform 961 represents the gate-source voltage dependence of the drain current of the transistor 911. In a program operation, no hot carriers are injected into the transistor 911; thus the electrical characteristics of the transistor 911 remain unchanged between before and after a program operation.

Before a program operation, the unit MOSFETs constituting the transistors 911 and 912 all have the same electrical characteristics; thus, when a common voltage higher than their gate threshold voltage is fed to the gates of the transistors 911 and 912, the drain current of the transistor 912 is higher than the drain current of the transistor 911. The state where the drain current of the transistor 912 is higher than the drain current of the transistor 911 corresponds to the state where data of "0" is stored in the memory segment 910. Accordingly, if in a read operation the drain current of the transistor 912 is higher than the drain current of the transistor 911, the signal output circuit 930 outputs a signal corresponding to data of "0" (e.g., a low-level signal)

Performing a program operation causes hot carriers to be injected into the individual unit MOSFETs in the transistor 912, and this increases the gate threshold voltage of the individual unit MOSFETs in the transistor 912. This corresponds to an increase in the gate threshold voltage of the transistor 912. A program operation is performed such that, after the program operation, the gate threshold voltage of the transistor 912 is well higher than the gate threshold voltage of the transistor 911. The gate threshold voltage of the transistor 912 after the program operation may be higher than the read voltage; when after the program operation a read operation is performed, the drain current of the transistor 911 is higher than the drain current of the transistor 912. The state where the drain current of the transistor 911 is higher than the drain current of the transistor 912 corresponds to the state where data of "1" is stored in the memory segment 910. Accordingly, if in a read operation the drain current of the transistor 911 is higher than the drain current of the transistor 912, the signal output circuit 930 outputs a signal corresponding to data of "1" (e.g., a high-level signal).

A non-volatile memory may be configured such that the stored data in its initial state is indefinite. Inconveniently, using a non-volatile memory of that type necessitates coping with the indefinite stored data with an extra, peripheral circuit. This may be disadvantageous from viewpoints of circuit scale etc. By contrast, the storage circuit 901 of FIG. 1 permits the stored data to be definitely "0" in the initial state; only when a program operation is performed can the stored data be turned to "1".

For reduction of the size of a circuit as a whole, memory elements (911, 912) are often required to be reduced in size. Reducing the size of memory elements leads to a larger mismatch between the memory elements. That is, while the individual unit MOSFETs of the transistors 911 and 912 are formed on a semiconductor substrate with an intention to give them the same electrical characteristics, in reality the electrical characteristics of the formed unit MOSFETs exhibit variations, which correspond to a mismatch. Such a mismatch causes inconveniences, such as by impairing proper storing and reading of data. Or, to store and read data properly with consideration given to a mismatch necessitates, for example, increasing the value of "n" mentioned above to a great extent. The following description of a first embodiment will present a storage circuit that is less liable to be affected by a mismatch as mentioned above.

First Embodiment

Figure 4:
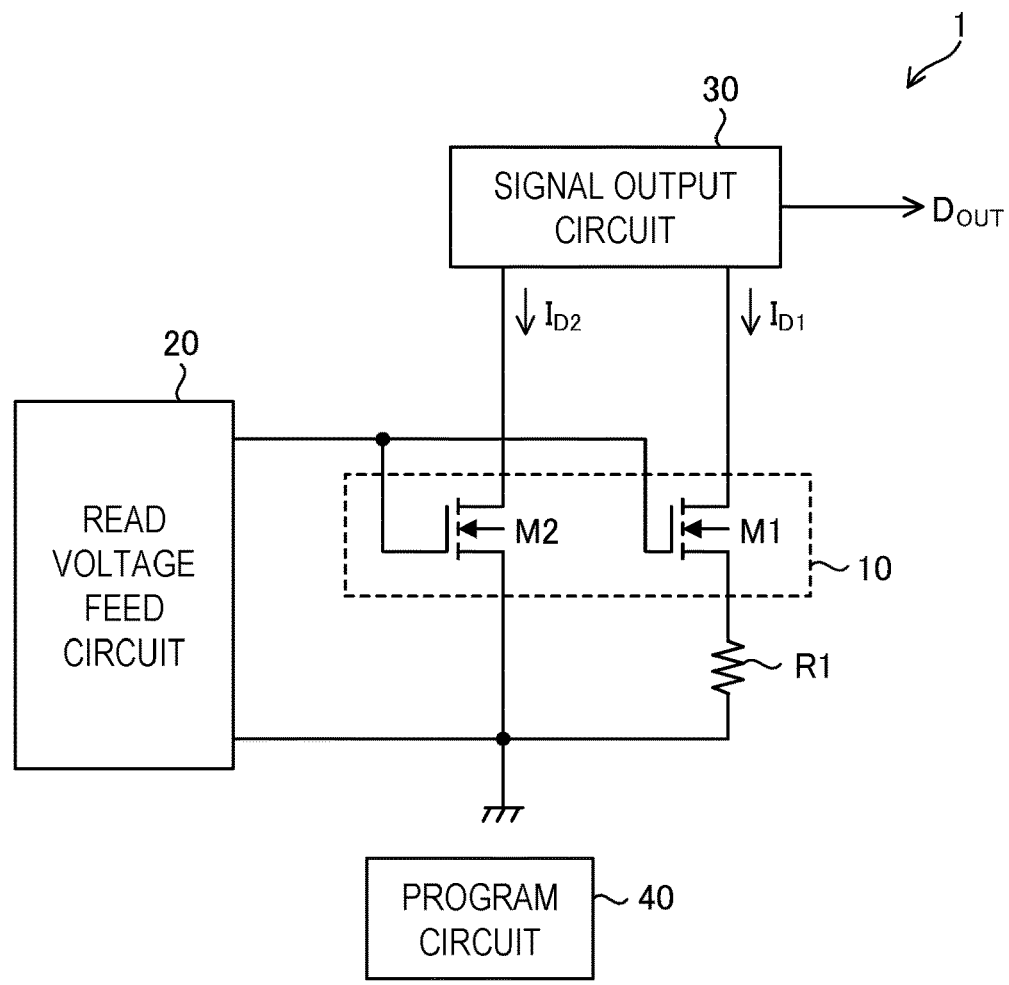
FIG. 4 is a configuration diagram of a storage circuit according to a first embodiment of the present disclosure.

A first embodiment according to the present disclosure will be described. FIG. 4 is a configuration diagram showing a principal part of a storage circuit 1 according to the first embodiment. The storage circuit 1 is anon-volatile memory that stores one-bit data, and includes a memory segment 10, a read voltage feed circuit 20, a signal output circuit 30, and a program circuit 40, and further includes a resistor R1. The storage circuit 1 can be configured as a semiconductor integrated circuit.

The memory segment 10 includes memory elements M1 and M2, and the memory segment 10 stores data of "0" or data of "1". The memory elements M1 and M2 are each a transistor. Accordingly, the memory elements M1 and M2 are referred to also as transistors M1 and M2 (first and second transistors). The memory elements M1 and M2 are each configured as an N-channel MOSFET. The transistors M1 and M2 have the same structure and, before a program operation by the program circuit 40, have the same electrical characteristics. Accordingly, before a program operation by the program circuit 40, the transistors M1 and M2 have the same gate threshold voltages. Here, for transistors, their structure is to be understood to cover their size; accordingly, for a plurality of given transistors, their having the same structure means that they are the same size. Note however that, for a plurality of given transistors, their having the same structure or electrical characteristics means that they are so designed and does not exclude practically inevitable errors (i.e., the term "same" is to be understood to allow for errors).

The gates of the transistors M1 and M2 are connected together. The source of the transistor M1 is connected via the resistor R1 to a ground. That is, the source of the transistor M1 is connected to one terminal of the resistor R1, and the other terminal of the resistor R1 is connected to the ground. By contrast, the source of the transistor M2 is connected directly to the ground. The drains of the transistors M1 and M2 are connected to the signal output circuit 30. The drain current of the transistor M1 is identified by "$I_{D1}$", and the drain current of the transistor M2 is identified by "$I_{D2}$".

The storage circuit 1 can perform a read operation to read the data stored in the memory segment 10 and a program operation (write operation) to rewrite the data stored in the memory segment 10 from "0" to "1".

The read voltage feed circuit 20 is a circuit that functions effectively in a read operation; in a read operation, it feeds the gates of the transistors M1 and M2 with a read voltage to turn on at least one of the transistors M1 and M2. Note however that, here, owing to the source of the transistor M1 being connected by way of the resistor R1, in a read operation, the transistor M1 is between its gate and source fed with a voltage resulting from subtracting the voltage drop across the resistor R1 from the read voltage (i.e., the read voltage is fed between, of the two terminals of the resistor R1, the one connected to the ground and the gate of the transistor M1). By contrast, in a read operation, the transistor M2 is between its gate and source fed with the read voltage as it is. The read voltage is higher at least than the gate threshold voltage of the transistor M1. Accordingly, in a read operation, at least the transistor M1 is on, that is, in a state where it permits a drain current $I_{D1}$ to pass through it. In a read operation, the signal output circuit 30 outputs a signal $D_{OUT}$ corresponding to the value of the data stored in the memory segment 10 based on the magnitude relationship between the drain currents of the transistors M1 and M2.

A program operation is carried out by the program circuit 40. In a program operation, the program circuit 40 injects hot carriers into the transistor M2 to degrade its electrical characteristics, and thereby increases (raises) the gate threshold voltage of the transistor M2.

Figure 5:
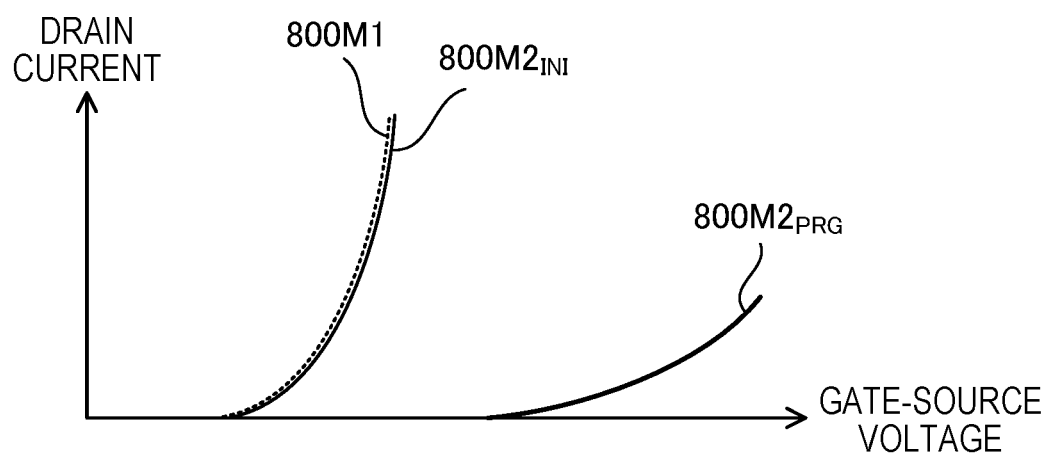
FIG. 5 is a diagram showing the characteristics of each transistor in FIG. 4.

Refer to FIG. 5. In FIG. 5, the solid-line waveform 800M2$_{INI}$ represents the gate-source voltage dependence of the drain current of the transistor M2 before a program operation (i.e., with the storage circuit 1 in the initial state), and the solid-line waveform 800M2$_{PRG}$ represents the gate-source voltage dependence of the drain current of the transistor M2 after a program operation. The broken-line waveform 800M1 represents the gate-source voltage dependence of the drain current of the transistor M1. In a program operation, no hot carriers are injected into the transistor M1; thus the electrical characteristics of the transistor M1 remain unchanged between before and after a program operation. Ideally, the waveforms 800M1 and 800M2$_{INI}$ coincide; in FIG. 5, for convenience of illustration, the waveforms 800M1 and 800M$_{INI}$ are shown slightly displaced.

Before a program operation, the transistors M1 and M2 have the same electrical characteristics; thus, when a common voltage higher than their gate threshold voltage is fed to the gates of the transistors M1 and M2, the drain current $I_{D2}$ of the transistor M2 is higher than the drain current $I_{D1}$ of the transistor M1. The state where the drain current $I_{D2}$ is higher than the drain current $I_{D1}$ corresponds to the state where data of "0" is stored in the memory segment 10. Accordingly, when in a read operation the drain current $I_{D2}$ is higher than the drain current $I_{D1}$, the signal output circuit 30 outputs a signal $D_{OUT}$ corresponding to data of "0" (e.g., a low-level signal $D_{OUT}$). In a read operation before a program operation, the drain current $I_{D2}$ is higher than the drain current $I_{D1}$.

As a result of hot carriers being injected into the transistor M2 in a program operation, the gate threshold voltage of the transistor M2 increases. The program operation is performed such hat, after the program operation, the gate threshold voltage of the transistor M2 is well higher than the gate threshold voltage of the transistor M1. The gate threshold voltage of the transistor M2 after a program operation may be higher than the read voltage. When after a program operation a read operation is performed, the drain current $I_{D1}$ is higher than the drain current $I_{D2}$. The state where the drain current $I_{D1}$ is higher than the drain current $I_{D2}$ corresponds to the state where data of "1" is stored in the memory segment 10. Accordingly, when in a read operation the drain current $I_{D1}$ is higher than the drain current $I_{D2}$, the signal output circuit 30 outputs a signal $D_{OUT}$ corresponding to data of "1" (e.g., a high-level signal $D_{OUT}$).

With the circuit configuration of FIG. 4, it is possible to configure a storage circuit that is less liable to be affected by a mismatch.

The interconnections in FIG. 4 and the interconnections described above in association with the circuit in FIG. 4 are those as they are when a read operation is performed; when a program operation is performed, the source and drain of the transistor M2 may be interchanged (though this is not essential). Specifically, seeing that, of the first and second electrodes of the transistor M2, the one at the higher potential functions as the drain and the one at the lower potential as the source, the interconnections in the relevant circuits may be changed by use of switches or the like (not illustrated in FIG. 4) such that, of the first and second electrodes of the transistor M2, the one connected to the ground (the one that functions as the source) in a read operation functions as the drain in a program operation (a description will later be given of a specific example of a circuit that achieves that).

The first embodiment includes practical examples EX1_1 to EX1_4 described below. Unless inconsistent, the features described above in connection with the first embodiment apply to practical examples EX1_1 to EX1_4 described below; for any features of the practical examples that contradict those described above in connection with the first embodiment, the description given in connection with the practical examples may prevail. Unless inconsistent, any features of any one of practical examples EX1_1 to EX1_4 can be applied to any other (i.e., any two or more of those practical examples may be implemented in combination).

Practical Example EX1_1

Figure 6:
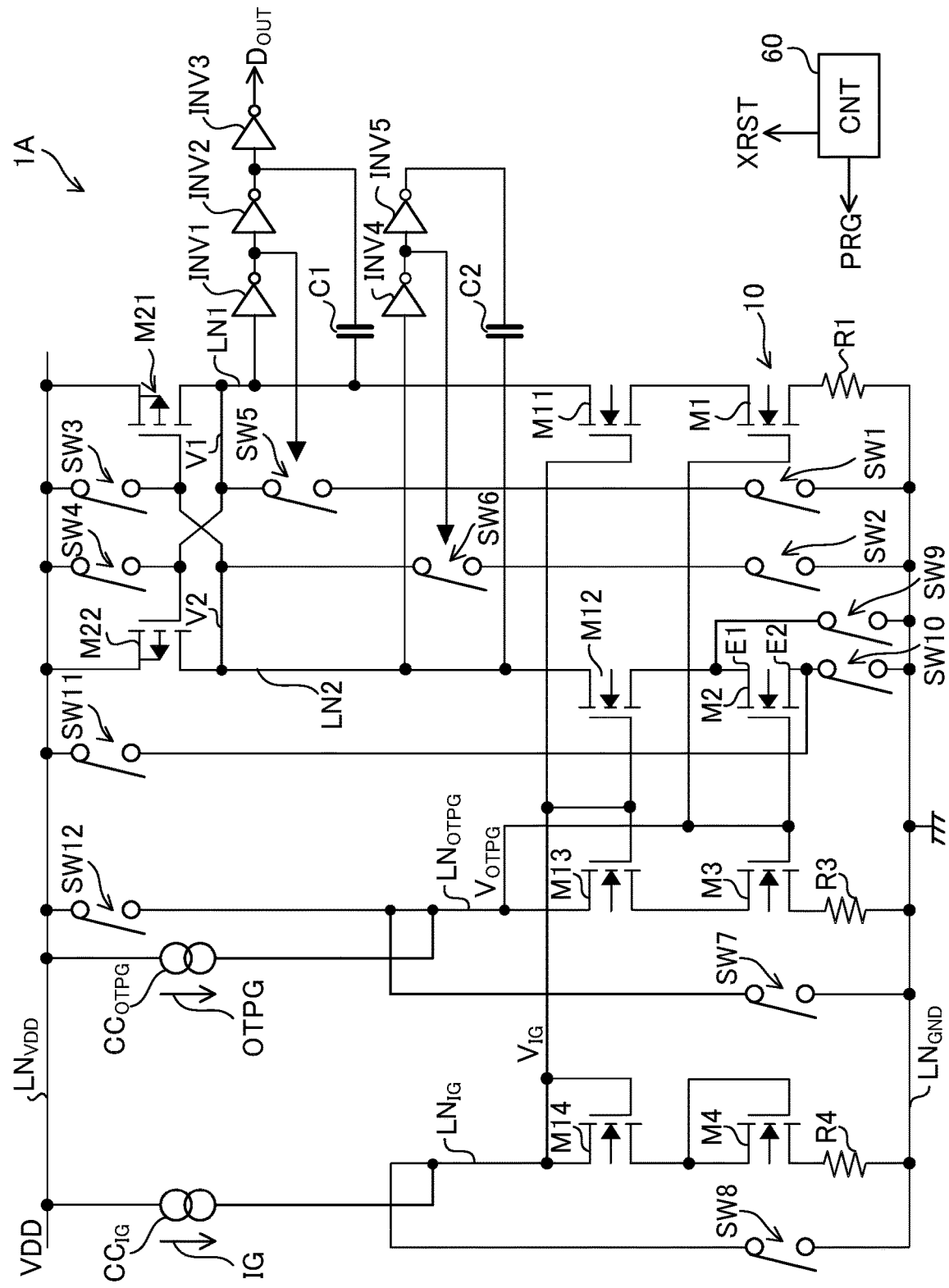
FIG. 6 is a diagram showing a configuration of a storage circuit according to Practical Example EX1_1 belonging to the first embodiment of the present disclosure.

Practical Example EX1_1 will be described. FIG. 6 shows the configuration of a storage circuit 1A according to Practical Example EX1_1. The storage circuit 1A is one example of the storage circuit 1 in FIG. 4. The storage circuit 1A includes transistors M1 to M4, M11 to M14, M21, and M22, switches SW1 to SW12, resistors R1, R3, and R4, capacitors C1 and C2, inverters INV1 to INV5, constant current circuits $CC_{IG}$ and $CC_{OTPG}$, and a control circuit 60. The storage circuit 1A can be configured as a semiconductor integrated circuit.

The transistors M1 to M4 and M11 to M14 are N-channel MOSFETs, and the transistors M21 and M22 are P-channel MOSFETs. The control circuit 60 outputs signals XRST and PRG. The signals XRST and PRG are each a binary signal that takes as its signal level low or high level. Based on the signals XRST and PRG, the switches SW1 to SW12 are turned on and off. What is shown in FIG. 6 assumes that all the switches are off (the same applies to FIG. 7 referred to later).

A description will now be given of the interconnections among the elements constituting the storage circuit 1A. A positive supply voltage VDD is applied to a supply line $LN_{VDD}$. The supply voltage VDD has a predetermined positive direct-current voltage value. A ground line $LN_{GND}$ has a ground potential of 0 V.

The sources of the transistors M21 and M22 and one terminals of the switches SW3 and SW4 are connected to the supply line $LN_{VDD}$. The other terminal of the switch SW3 is connected to the gate of the transistor M21, and the other terminal of the switch SW4 is connected to the gate of the transistor M22. A line that is connected to the gate of the transistor M21 is referred to as the line LN2, and a voltage that is applied to the line LN2 is referred to as the voltage V2. A line that is connected to the gate of the transistor M22 is referred to as the line LN1, and a voltage that is applied to the line LN1 is referred to as the voltage V1. The drain of the transistor M21 is connected to the line LN1, and the drain of the transistor M22 is connected to the line LN2.

The input terminal of the inverter INV1 is connected to the line LN1. The output terminal of the inverter INV1 is connected to the input terminal of the inverter INV2. The output terminal of the inverter INV2 is connected to the input terminal of the inverter INV3, and is also connected via the capacitor C1 to the line LN1. The input terminal of the inverter INV4 is connected to line LN2. The output terminal of the inverter INV4 is connected to the output terminal of the inverter INV5. The output terminal of the inverter INV5 is connected via the capacitor C2 to the line LN2.

One terminal of the switch SW5 is connected to the line LN1, and the other terminal of the switch SW5 is connected to one terminal of the switch SW1. The other terminal of the switch SW1 is connected to the ground line $LN_{GND}$. One terminal of the switch SW6 is connected to the line LN2, and the other terminal of the switch SW6 is connected to one terminal of the switch SW2. The other terminal of the switch SW2 is connected to the ground line $LN_{GND}$.

The gates of the transistors M11 to M14 are all connected to a gate line $LN_{IG}$. A voltage that is applied to the gate line $LN_{IG}$ is referred to as the gate voltage $V_{IG}$. The gates of the transistors M1 to M3 are all connected to a gate line $LN_{OTPG}$. A voltage that is applied to the gate line $LN_{OTPG}$ is referred to as the gate voltage $V_{OTPG}$.

The drain of the transistor M11 is connected to the line LN1, and the source of the transistor M11 is connected to the drain of the transistor M1. The source of the transistor M1 is connected via the resistor R1 to the ground line $LN_{GND}$. That is, the source of the transistor M1 is connected to one terminal of the resistor R1, and the other terminal of the resistor R1 is connected to the ground line $LN_{GND}$.

The drain of the transistor M12 is connected to the line LN2, and the source of the transistor M12 is connected to an electrode E1 of the transistor M2. Between the electrode E1 of the transistor M2 and the ground line $LN_{GND}$, the switch SW9 is inserted in series. Between an electrode E2 of the transistor M2 and the ground line $LN_{GND}$, the switch SW10 is inserted in series. Between the electrode E2 of the transistor M2 and the supply line $LN_{VDD}$, the switch SW11 is inserted in series. Of the electrodes E1 and E2 of the transistor M2, the one at the high-potential side functions as the drain and the one at the low-potential side functions as the source. As will become clear from a description given later, in a read operation, the switches SW9, SW10, and SW11 are kept off, on, and off respectively so that the electrode E1 functions as the drain; in a program operation, the switches SW9, SW10, and SW11 are kept on, off, and on respectively so that the electrode E2 functions as the drain.

Between the supply line $LN_{VDD}$ and the gate line $LN_{OTPG}$, the switch SW12 is inserted in series, and between the gate line $LN_{OTPG}$ and the ground line $LN_{GND}$, the switch SW7 is inserted in series. The drain of the transistor M13 is connected to the gate line $LN_{OTPG}$, and the source of the transistor M13 is connected to the drain of the transistor M3. The source of the transistor M3 is connected via the resistor R3 to the ground line $LN_{GND}$.

Between the gate line $LN_{IG}$ and the ground line $LN_{GND}$, the switch SW8 is inserted in series. The drain of the transistor M14 is connected to the gate line $LN_{IG}$, and the source of the transistor M14 is connected to the drain of the transistor M4. The gate and the drain of the transistor M4 are connected together. The source of the transistor M4 is connected via the resistor R4 to the ground line $LN_{GND}$.

The constant current circuit $CC_{IG}$ is connected to the gate line $LN_{IG}$. For as long a period as is needed that includes the period in which a read operation is performed, the constant current circuit $CC_{IG}$ generates a constant current IG based on the supply voltage VDD, and feeds the constant current IG to the gate line $LN_{IG}$. The constant current circuit $CC_{OTPG}$ is connected to the gate line $LN_{OTPG}$. For as long a period as is needed that includes the period in which a read operation is performed, the constant current circuit $CC_{OTPG}$ generates a constant current OTPG based on the supply voltage VDD, and feeds the constant current OTPG to the gate line $LN_{OTPG}$.

Any of the inverters INV1 to INV5 outputs from its output terminal the inversion signal of the input signal to its input terminal. Specifically, each inverter, if the input voltage to its input terminal is lower than a predetermined threshold voltage, outputs from its output terminal a signal with a level well higher than the threshold voltage and, if the input voltage to its input terminal is equal to or higher than a predetermined threshold voltage, outputs from its output terminal a signal with a level well lower than the threshold voltage. The inverters INV1 to INV5 operate based on the supply voltage VDD, and the threshold voltage of each inverter is approximately one-half of the supply voltage VDD. The threshold voltage of each inverter may be given hysteresis. The output signal of the inverter INV3 is the output signal $D_{OUT}$ of the storage circuit 1A. A signal that corresponds to the value of the data stored in the memory segment 10 composed of the transistors M1 and M2 is, through a read operation, output as the output signal $D_{OUT}$.

The control terminal of the switch SW5 is connected to the output terminal of the inverter INV1. The switch SW5 is on or off if the output signal of the inverter INV1 is at high level or low level respectively. The control terminal of the switch SW6 is connected to the output terminal of the inverter INV4. The switch SW6 is on or off if the output signal of the inverter INV4 is at high level or low level respectively.

Figure 7:
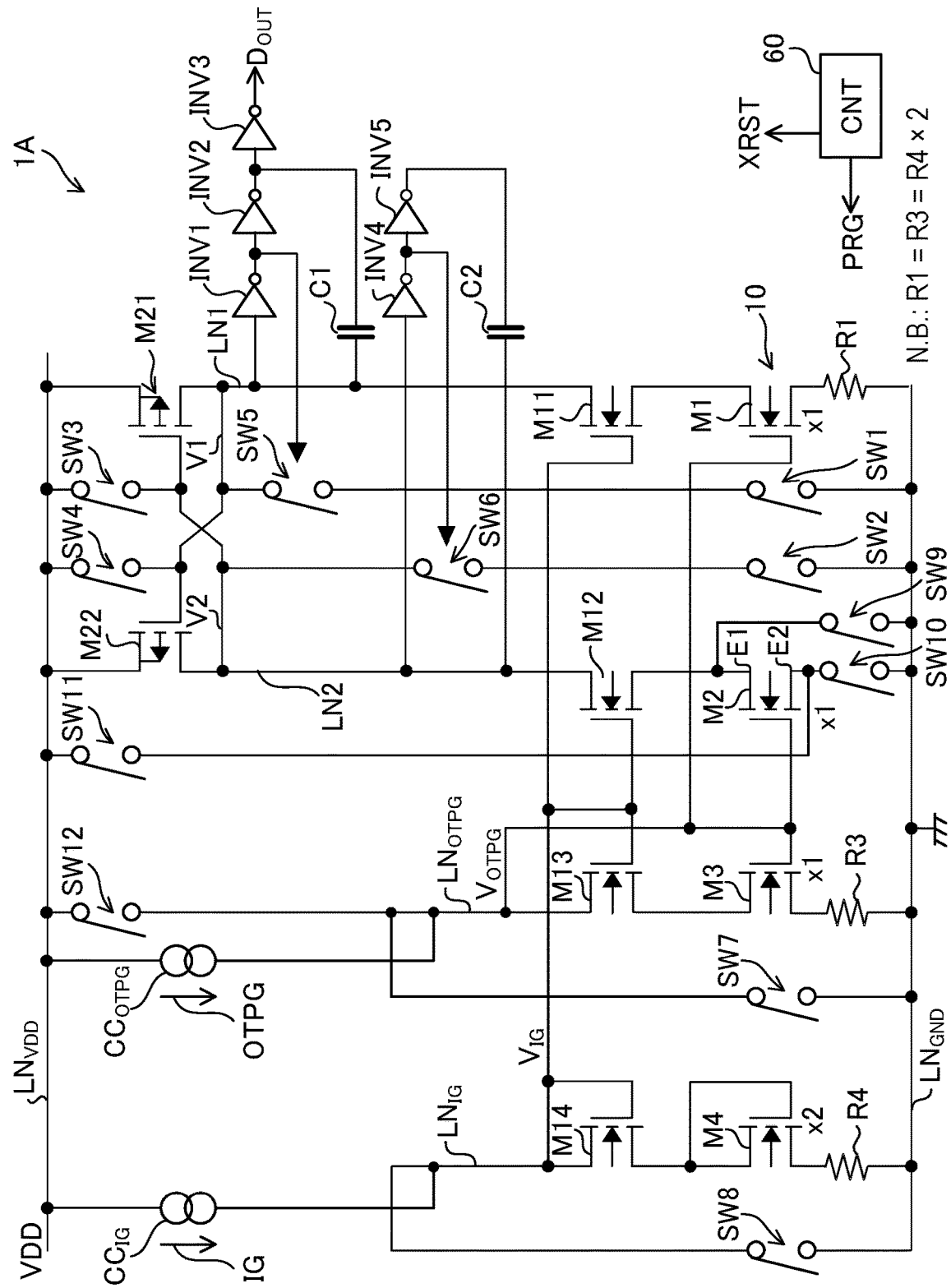
FIG. 7 is a diagram showing a configuration of a storage circuit according to Practical Example EX1_1 belonging to the first embodiment of the present disclosure.

As described above, the transistors M1 and M2 have the same structure and, before a program operation, have the same electrical characteristics (including gate threshold voltage). Moreover, it is here assumed that the storage circuit 1A employs a configuration as described below (FIG. 7). Specifically, the storage circuit 1A has formed in it a first to a fifth unit N-channel MOSFET, the first, second, and third unit MOSFETs constituting the transistors M1, M2, and M3 respectively, the parallel circuit of the fourth and fifth unit MOSFETs constituting the transistor M4. The first to fifth unit MOSFETs all have the same structure and, before a program operation, have the same electrical characteristics (including gate threshold voltage). In addition, the resistance values of the resistors R1 and R3 are set to be the same, and the resistance value of the resistor R4 is set at one-half of the resistance value of the resistor R1. The constant current IG is set at twice the constant current OTPG. The transistors M1 to M14 may be transistors with the same structure and the same electrical characteristics (including gate threshold voltage).

—Read Operation $RD_{INI}$ Before a Program Operation—

In the following description, for convenience of description, a read operation performed before a program operation is occasionally referred to particularly as a read operation $RD_{INI}$, and a read operation performed after a program operation is occasionally referred to particularly as a read operation $RD_{PRG}$. What is referred to simply as a read operation denotes any read operation regardless of before or after a program operation.

Figure 8:
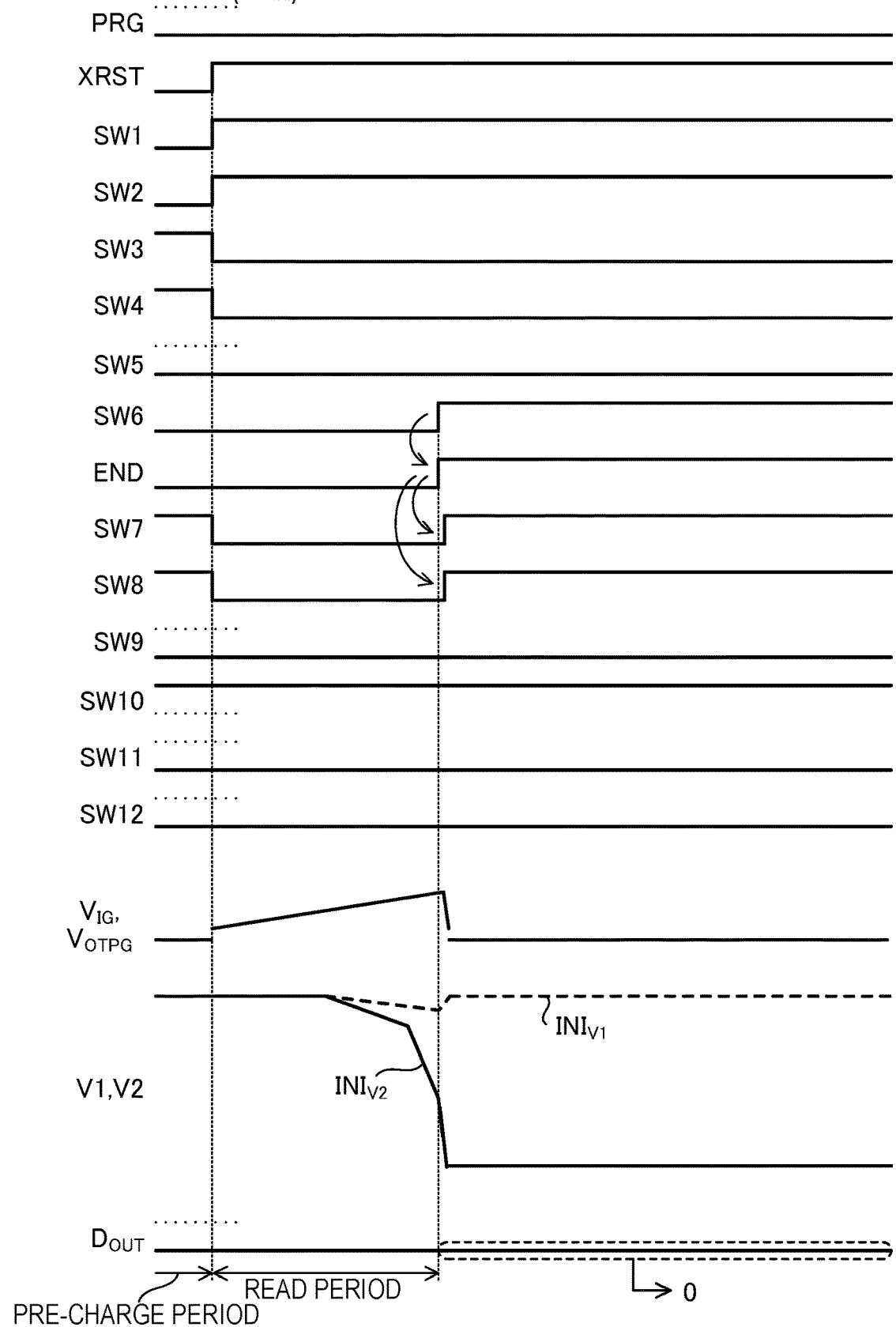
FIG. 8 is a timing chart of a read operation before a program operation according to Practical Example EX1_1 belonging to the first embodiment of the present disclosure.

FIG. 8 is a timing chart of a read operation Ram. In a read operation, the low-level period of the signal XRST is referred to as the pre-charge period and, within the high-level period of the signal XRST, the period during which the switches SW5 and SW6 are both off is referred to as the read period. A read operation is carried out during the read period after the pre-charge period. During a period (including the pre-charge period and the read period) in which no program operation is performed, the signal PRG is kept at low level. Under a condition that the signal PRG is at low level, a shift of the signal XRST from low level to high level causes a transition from the pre-charge period to the read period and, through the read period, a signal corresponding to the data stored in the memory segment 10 is output as the output signal $D_{OUT}$.

Figure 9:
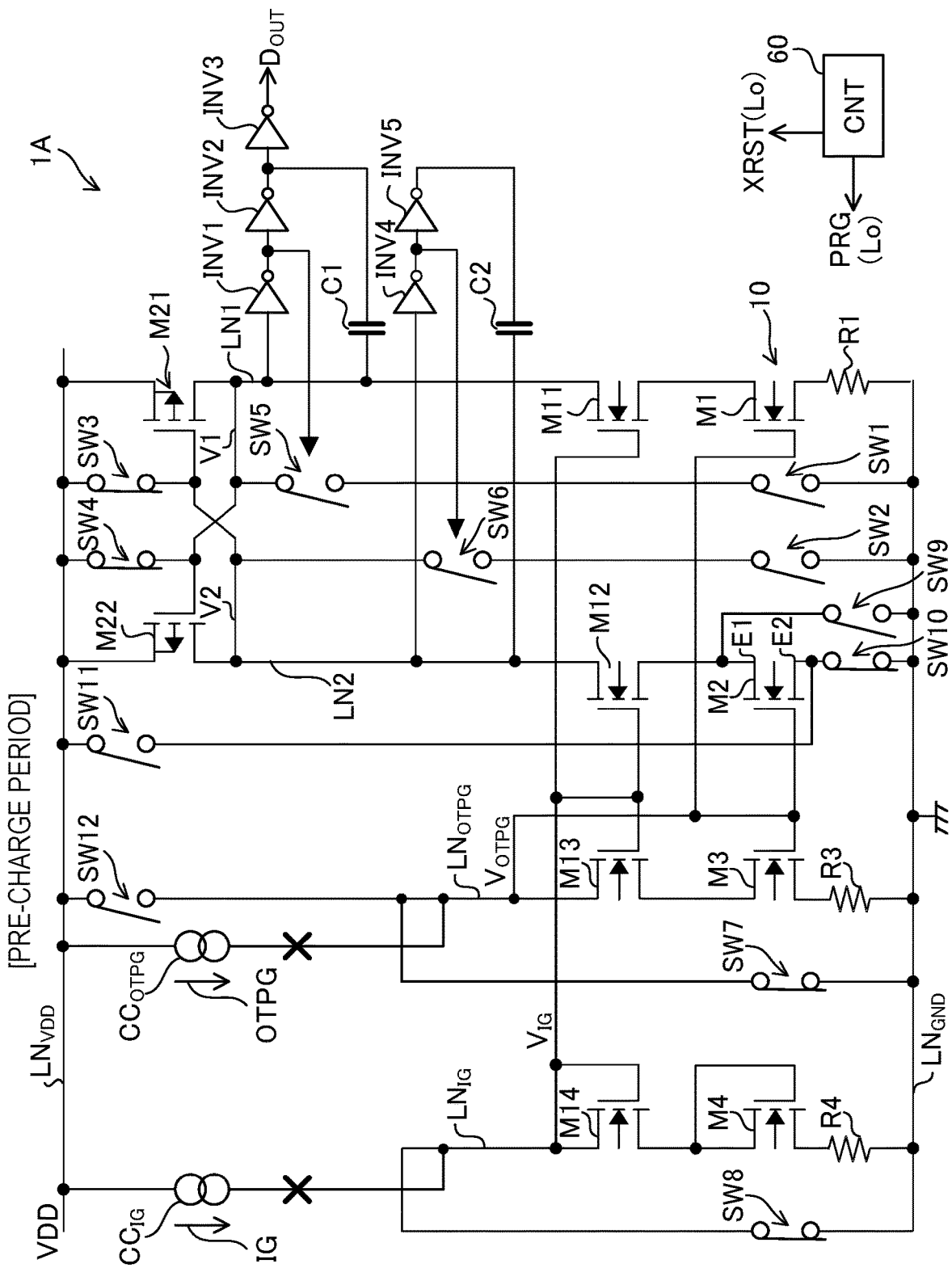
FIG. 9 is a diagram showing a state (of switches) during a pre-charge period in a read operation according to Practical Example EX1_1 belonging to the first embodiment of the present disclosure.

During the pre-charge period, owing to the signals XRST and PRG being at low level, as shown in FIG. 9, the switches SW1 and SW2 are off and the switches SW3, SW4, SW7, and SW8 are on; the constant current circuits $CC_{IG}$ and $CC_{OTPG}$ keep from generating and outputting constant currents. Moreover, during the low-level period of the signal PRG, owing to the signal PRG being at low level, the switches SW9, SW11, and SW12 are off and the switch SW10 is on. During a period (including the pre-charge period and the read period) in which no program operation is performed, of the transistor M2, the electrode E1 functions as the drain and the electrode E2 functions as the source.

In FIG. 8, the broken-line waveform INN' is the waveform of the voltage V1 in a read operation $RD_{INI}$, and the solid-line waveform $INI_{V2}$ is the waveform of the voltage V2 in a read operation $RD_{INI}$. Through the pre-charge period and the first half of the read period, the waveforms INN' and $INI_{V2}$ coincide. In the pre-charge period, the voltages $V_{IG}$ and $V_{OTPG}$ are 0 V, and thus the transistors M1 to M4 and M11 to M14 are all off. Moreover, in the pre-charge period, a positive electric charge is fed via the switches SW4 and SW3 to the lines LN1 and LN2, and the voltages V1 and V2 reach the level of the supply voltage VDD. Accordingly, in the pre-charge period, the output signals of the inverters INV1 and INV4 are at low level, with the result that the switches SW5 and SW6 are off.

Figure 10:
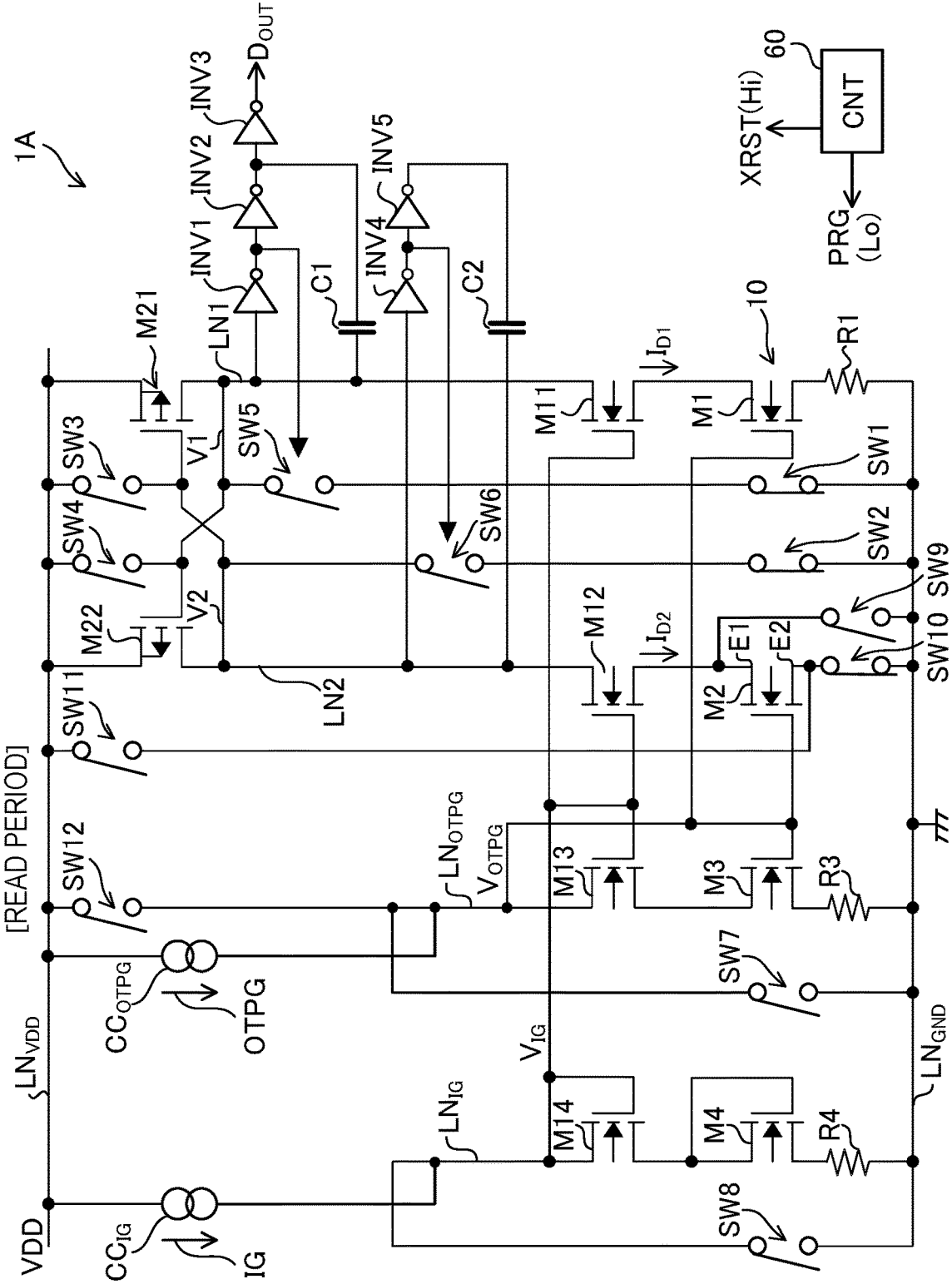
FIG. 10 is a diagram showing a state (of switches) during a read period in a read operation according to Practical Example EX1_1 belonging to the first embodiment of the present disclosure.

A shift of the signal XRST from low level to high level causes a transition from the pre-charge period to the read period. In the read period, owing to the signal XRST being at high level and the signal PRG being at low level, as shown in FIG. 10, the switches SW1 and SW2 are on and the switches SW3, SW4, SW7, and SW8 are off. Moreover, in the read period, the constant current circuits $CC_{IG}$ and $CC_{OTPG}$ generate and output constant currents. As a result, in the read period, a constant current $I_{IG}$ causes the gate voltage $V_{IG}$ to rise and a constant current $I_{OTPG}$ causes the gate voltage $V_{OTPG}$ to rise. Here, keeping the constant current $I_{IG}$ higher than the constant current $I_{OTPG}$ permits the gate voltage $V_{IG}$ to rise faster than the gate voltage $V_{OTPG}$ (e.g., a setting such that $I_{IG}=I_{OTPG}\times 2$ permits the gate voltage $V_{IG}$ to rise twice faster than the gate voltage $V_{OTPG}$) so that, before the gate voltage $V_{OTPG}$ reaches the gate threshold voltage of the transistor M1 or M2, the transistors M11 to M14 are off. In FIG. 8, the waveform of one of the gate voltages $V_{IG}$ and $V_{OTPG}$ is shown as their representative (the same applies to FIG. 12, which will be referred to later).

In the read period, as the gate voltages $V_{IG}$ and $V_{OTPG}$ rise, the transistors M4 and M11 to M14 turn on, and drain currents pass through the transistors M1 to M3. In the read period, the drain current passing through the transistor M1 is identified by the symbol "$I_{D1}$" and the drain current passing through the transistor M2 is identified by the symbol "$I_{D2}$" (see FIG. 10). The gate voltage $V_{OTPG}$ during the read period corresponds to the read voltage mentioned above. A voltage resulting from subtracting the voltage drop across the resistor R1 from the gate voltage $V_{OTPG}$ (read voltage) is fed between the gate and the source of the transistor M1, and the gate voltage $V_{OTPG}$ (read voltage) itself is applied between the gate and the source of the transistor M2 (the on resistance of the switch SW10 is ignored as being very low). Thus, in a read period before a program operation, the drain current $I_{D2}$ is higher than the drain current ID', and hence the voltage V2 falls faster than the voltage V1. Moreover, while the voltage V2 is falling, a drain current starts to pass through the transistor M21; thus, when the voltage V2 has fallen to a certain extend, the voltage V1 stops falling and thereafter rises to the level of the supply voltage VDD.

Figure 11:
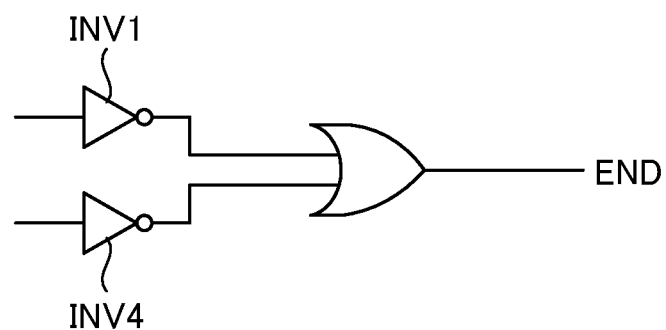
FIG. 11 is a diagram showing a relationship among a plurality of signals according to Practical Example EX1_1 belonging to the first embodiment of the present disclosure.

When, while V1>V2, the voltage V2 falls below the threshold voltage of the inverter INV4, the output signal of the inverter INV4 turns from low level to high level, and the switch SW6 turns from off to on. As shown in FIG. 11, a signal END is the OR signal of the output signals of the inverters INV1 and INV4. Accordingly, when at least one of the output signals of the inverters INV1 and INV4 turns to high level, the signal END turns to high level. The signal END can be understood to be an internal signal that is generated within the control circuit 60.

In response to the signal END turning to high level, the control circuit 60 stops the constant current circuits $CC_{IG}$ and $CC_{OTPG}$ from generating and outputting constant currents, and turns the switches SW7 and SW8 from off to on. Thus, the gate voltages $V_{IG}$ and $V_{OTPG}$ falls to 0 V.

The signal $D_{OUT}$ as it is after, in a read operation, the signal END has turned to high level is referred to specifically as the definitive read signal $D_{OUT}$. The definitive read signal $D_{OUT}$ represents the value of the data stored in the memory segment 10 (the value of the data read from the memory segment 10). The definitive read signal $D_{OUT}$ being at low level means that the value of that data is "0", and the definitive read signal $D_{OUT}$ being at high level means that the value of that data is "1". In the read operation $RD_{INI}$, the output signal of the inverter INV1 is held at low level; thus the definitive read signal $D_{OUT}$ is at low level, and data of "0" (i.e., the data of the initial value) is read out. Once, in the read operation $RD_{INI}$, the signal END turns to high level, the definitive read signal $D_{OUT}$ representing data of "0" continues being output. This eliminates the need for a latch circuit in the succeeding stage, and it is possible to feed the definitive read signal $D_{OUT}$ directly to a circuit that needs it (e.g., a trimming switch that is turned on and off according to the data stored in the memory segment 10).

—Read Operation $RD_{PRG}$ After a Program Operation—

Figure 12:
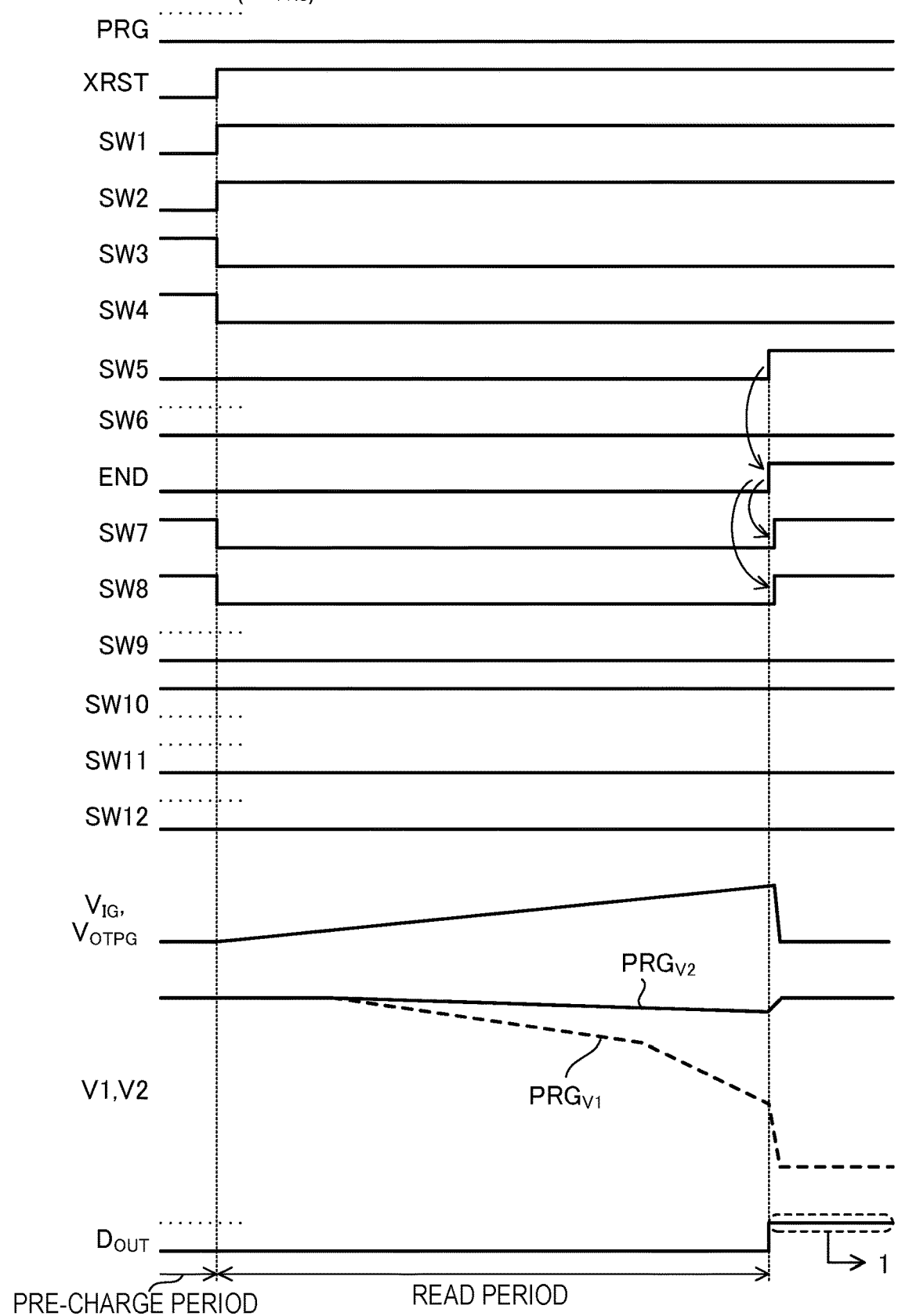
FIG. 12 is a timing chart of a read operation after a program operation according to Practical Example EX1_1 belonging to the first embodiment of the present disclosure.

FIG. 12 is a timing chart of a read operation $RD_{PRG}$ (i.e., a read operation performed after a program operation). In FIG. 12, the broken-line waveform $PRG_{V1}$ represents the waveform of the voltage V1 in a read operation $RD_{PRG}$, and the solid-line waveform $PRG_{V2}$ represents the waveform of the voltage V2 in a read operation $RD_{PRG}$. Through the pre-charge period and the first half of the read period, the waveforms $PRG_{V1}$ and $PRG_{V2}$ coincide.

There is no difference between before and after a program operation in what is performed in a read operation, including how the states of the individual switches are controlled in the pre-charge period and the read period. However, through the program operation performed before a read operation $RD_{PRG}$, of the transistors M1 and M2, only the transistor M2 has been degraded such that only the transistor M2 has a greatly increased gate threshold voltage. Accordingly, during the read period in the read operation $RD_{PRG}$, the drain current $I_{D1}$ is higher than the drain current $I_{D2}$, with the result that the voltage V1 falls faster than the voltage V2. Moreover, while the voltage V1 is falling, a drain current starts to pass through the transistor M22. Thus, when the voltage V1 has fallen to a certain extent, the voltage V2 stops falling and thereafter rises to the level of the supply voltage VDD.

When, while V1<V2, the voltage V1 falls below the threshold voltage of the inverter INV1, the output signal of the inverter INV1 turns from low level to high level, and the switch SW5 turns from off to on. Moreover, when the output signal of the inverter INV1 turns from low level to high level, the signal END too turns from low level to high level (see FIG. 11). In response to the signal END turning to high level, the control circuit 60 stops the constant current circuits $CC_{IG}$ and $CC_{OTPG}$ from generating and outputting constant currents and turns the switches SW7 and SW8 from off to on. Thus, the gate voltages $V_{IG}$ and $V_{OTPG}$ falls to 0 V.

The signal $D_{OUT}$ as it is after, in a read operation, the signal END has turned to high level is referred to specifically as the definitive read signal $D_{OUT}$. In a read operation $RD_{PRG}$, in response to the voltage V1 falling, the output signal of the inverter INV1 turns to high level; thus, the definitive read signal $D_{OUT}$ is at high level, and represents data of "1". Once, in the read operation $RD_{PRG}$, the signal END turns to high level, the definitive read signal $D_{OUT}$ representing data of "1" continues being output. This eliminates the need for a latch circuit in the succeeding stage, and it is possible to feed the definitive read signal $D_{OUT}$ directly to a circuit that needs it (e.g., a trimming switch that is turned on and off according to the data stored in the memory segment 10).

—Program Operation—

As described above, the state where, in a read operation (read period), the drain current $I_{D2}$ is higher than the drain current $I_{D1}$ corresponds to the state where data of "0" is stored in the memory segment 10. Thus in the read operation $RD_{INI}$ in FIG. 8, owing to the drain current $I_{D2}$ being higher than the drain current $I_{D1}$, a definitive read signal $D_{OUT}$ corresponding to data of "0" (here, a low-level signal $D_{OUT}$) is output. By contrast, the state where, in a read operation (read period), the drain current $I_{D1}$ is higher than the drain current $I_{D2}$ corresponds to the state where data of "1" is stored in the memory segment 10. Thus in the read operation $RD_{PRG}$ in FIG. 12, owing to the drain current $I_{D1}$ being higher than the drain current $I_{D2}$, a definitive read signal $D_{OUT}$ corresponding to data of "1" (here, a high-level signal $D_{OUT}$) is output.

In the storage circuit 1A in FIG. 6, a program operation that causes a transition from the read operation $RD_{INI}$ in FIG. 8 to the read operation $RD_{PRG}$ in FIG. 12 is carried out as described below.

Figure 13:
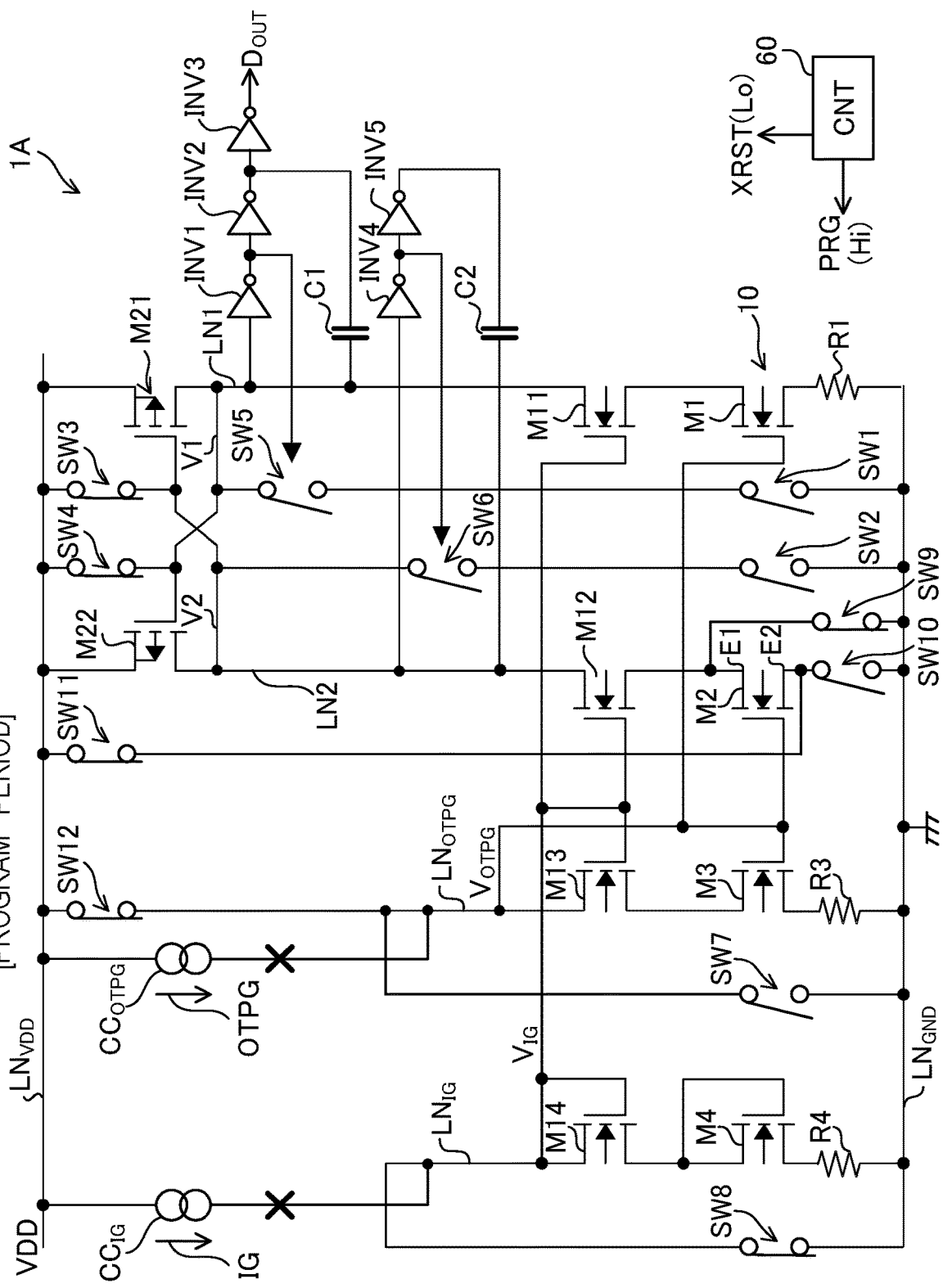
FIG. 13 is a diagram showing a state (of switches) during a program period according to Practical Example EX1_1 belonging to the first embodiment of the present disclosure.

FIG. 13 shows the states of the switches in the storage circuit 1A during a period in which a program operation is performed (hereinafter referred to as the program period). In the program period, the signal XRST is at low level and the signal PRG at high level, and based on those signals XRST and PRG, the switches SW1, SW2, SW7, and SW10 are off, and the switches SW3, SW4, SW8, SW9, SW11, and SW12 are on. Moreover, the constant current circuits $CC_{IG}$ and $CC_{OTPG}$ keep from generating and outputting constant currents. Thus, the electrode E2 and the gate of the transistor M2 are fed with the supply voltage VDD, and the electrode E1 of the transistor M2 is at a potential of 0 V. Moreover, the switch SW8 is on, and thus the transistors M11 to M14 are all off.

In the program period, the electrode E2 functions as the drain of the transistor M2, and the electrode E1 functions as the source of the transistor M2, a current passing from the electrode E2 to the electrode E1. While this current is passing, hot carriers are injected into the transistor M2, and the characteristics of the transistor M2 are degraded such that its gate threshold voltage is increased. The state in FIG. 13 is maintained for a length of time sufficient to increase the gate threshold voltage of the transistor M2 as desired, and then the signal PRG is turned from high level to low level to complete the program operation.

—Correspondence Between the Storage Circuit 1 and the Storage Circuit 1A—

A supplementary description will be given of the correspondence between the storage circuit 1 in FIG. 4 and the storage circuit 1A in FIG. 6. A feature common to the storage circuits 1 and 1A is that the transistors M1 and M2 constitute the memory segment 10.

The read voltage feed circuit 20 in FIG. 4 is, in the storage circuit 1A in FIG. 6, composed mainly of the transistor M3, the resistor R3, the constant current circuit $CC_{OTPG}$, and the switch SW7, and the transistor M13 may also be understood to be among the elements constituting the circuit 20. The storage circuit 1A in FIG. 6 can be thought of as being provided with a drain current control circuit for permitting or shutting off the supply of drain currents ($I_{D1}$, $I_{D2}$) to the transistors M1 and M2, and the drain current control circuit is composed of the transistors M11 to M14 and M4, the resistor R4, the constant current circuit $CC_{IG}$, and the switch SW8.

The signal output circuit 30 in FIG. 4 is, in the storage circuit 1A in FIG. 6, composed mainly of the transistors M21 and M22, the switches SW1 to SW6, the inverters INV1 to INV5, and the capacitors C1 and C2. Depending on the magnitudes of the parasitic capacitances that accompany the lines LN1 and LN2, the capacitors C1 and C2 and the inverter INV5 may be omitted.

The program circuit 40 in FIG. 4 is, in the storage circuit 1A in FIG. 6, composed mainly of the switches SW9 to SW12. Injecting hot carriers naturally requires the supply voltage VDD. Thus, a power supply circuit (not illustrated) that generates and outputs the supply voltage VDD may be understood to be among the elements constituting the program circuit 40. The same applies to the read voltage feed circuit 20 and the signal output circuit 30.

The control circuit 60 in FIG. 6 is understood to be a circuit that controls the operation of the read voltage feed circuit 20, the signal output circuit 30, and the program circuit 40 in FIG. 4 (and is also a circuit that controls the operation of the drain current control circuit mentioned above). The control circuit 60 may instead be understood to be a circuit that is shared among, as parts of, the circuits 20, 30, and 40 to carry out a read operation and a program operation.

With the storage circuits 1 and 1A, in a read operation, if $I_{D2} > I_{D1}$, a signal $D_{OUT}$ (definitive read signal $D_{OUT}$) associated with a first value is output and, if $I_{D2} < I_{D1}$, a signal $D_{OUT}$ (definitive read signal $D_{OUT}$) associated with a second value is output. While in the example of operation described above the first value is "0" and the second value is "1", so long as the first and second values differ, they may each be any value. The circuit configuration may be modified such that the signal $D_{OUT}$ associated with the first value is a high-level signal and that the signal $D_{OUT}$ associated with the second value is a low-level signal Practical Example EX1_2

Practical Example EX1_2 will be described. The storage circuit 1 or 1A shown in FIG. 4 or 6 is a first non-volatile memory that stores one-bit data. A plurality of storage circuits 1 or 1A each as a unit cell may be provided to constitute a second non-volatile memory that stores multibit data.

Or a set of a memory segment 10 and a signal output circuit 30 may be taken as a unit cell, and a plurality of such unit cells may be provided to constitute a third non-volatile memory. In a third non-volatile memory, the read voltage feed circuit 20 and the program circuit 40 are shared among a plurality of unit cells. Specifically, for example, with a third non-volatile memory, when a read operation is performed in two or more of the plurality of unit cells mentioned above, the read voltage feed circuit 20 can supply the read voltage to the gates of the transistors M1 and M2 in each of those two or more unit cells. Likewise, for example, with a third non-volatile memory, when a program operation is performed in two or more of the plurality of unit cells mentioned above, the program circuit 40 can inject hot carriers into the transistor M2 in each of those two or more unit cells.

In any case, in a non-volatile memory according to the present disclosure, the stored data may have any number, one or more, of bits, and as many memory segments 10 are provided as the number of bits in the stored data.

Practical Example EX1_3

Practical Example EX1_3 will be described. While Practical Example EX1_1 deals with a circuit configuration where a constant current is used to generate the read voltage, instead the read voltage feed circuit 20 in FIG. 4 may be a direct-current voltage source that, in a read operation, feeds a direct-current read voltage to the gates of the transistors M1 and M2.

Practical Example EX1_4

Practical Example EX1_4 will be described. A non-volatile memory according to the first embodiment (e.g., any of the non-volatile memories mentioned in connection with Practical Example EX1_2 above) can be incorporated in any circuit or device that carries out a predetermined functional operation.

When the circuit or device incorporating the non-volatile memory starts to be supplied with a supply voltage and starts up, it reads by a read operation the data stored in the non-volatile memory and carries out the predetermined functional operation according to the data so read.

For example, a non-volatile memory can be incorporated in an amplifier circuit (not illustrated) that can vary its gain according to trimming data. It is then possible to optimize the gain of the amplifier circuit by feeding it with, as trimming data, one or more pieces of data stored in the non-volatile memory.

A non-volatile memory according to the first embodiment can be incorporated in semiconductor integrated circuits for a variety of use, such as semiconductor integrated circuits for DC/DC converters and semiconductor integrated circuits for motor drivers. The amplifier circuit mentioned above is one example of circuits provided in such semiconductor integrated circuits.

Second Embodiment

Figure 14A:
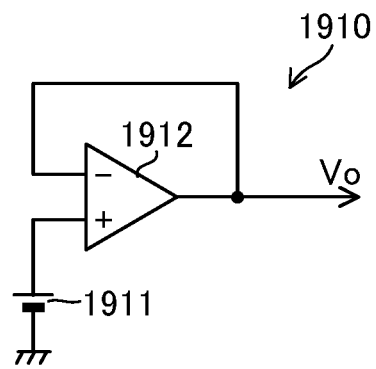
FIG. 14A is a diagram showing a configuration of a constant voltage source according to a second embodiment of the present disclosure.
Figure 14B:
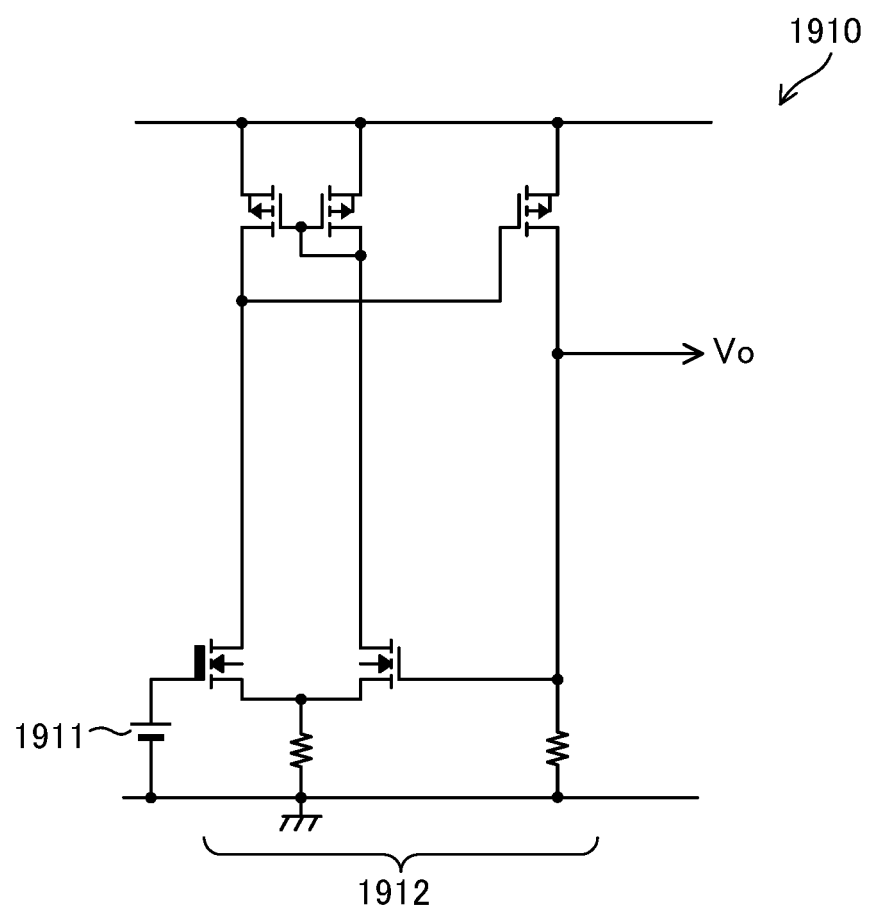
FIG. 14B is a diagram showing a configuration of a constant voltage source according to the second embodiment of the present disclosure.

A second embodiment of the present disclosure will be described. As shown in FIG. 14A, a common constant voltage source 1910 that is required to have given current output capacity is composed of a reference voltage source 1911, configured with a band gap reference or the like, and a buffer amplifier 1912 that outputs the output voltage of the reference voltage source 1911 with a low impedance. The constant voltage source 1910 outputs an output voltage Vo from the buffer amplifier 1912. FIG. 14B shows a configuration of the constant voltage source 1910 including an example of the internal circuit of the buffer amplifier 1912.

Figure 15A:
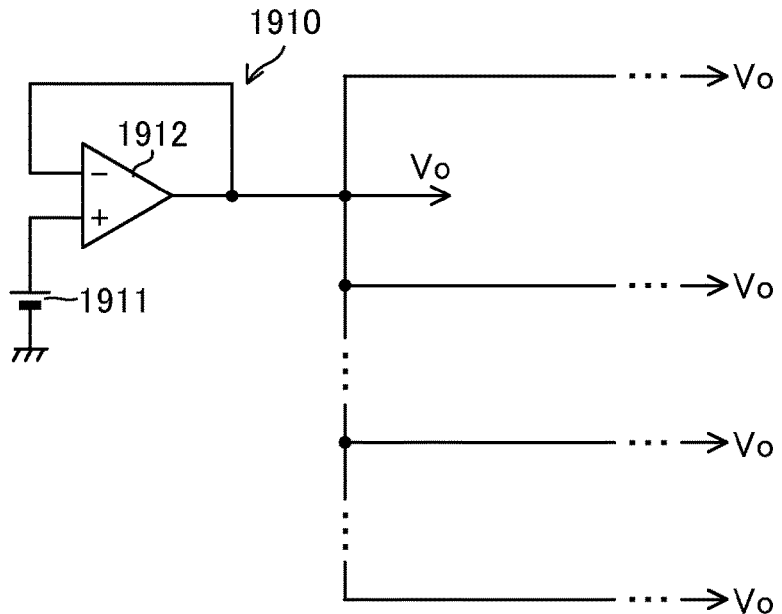
FIG. 15A is a diagram showing a scheme for coping with an output voltage of a constant voltage source being required at a plurality of places according to the second embodiment of the present disclosure.
Figure 15B:
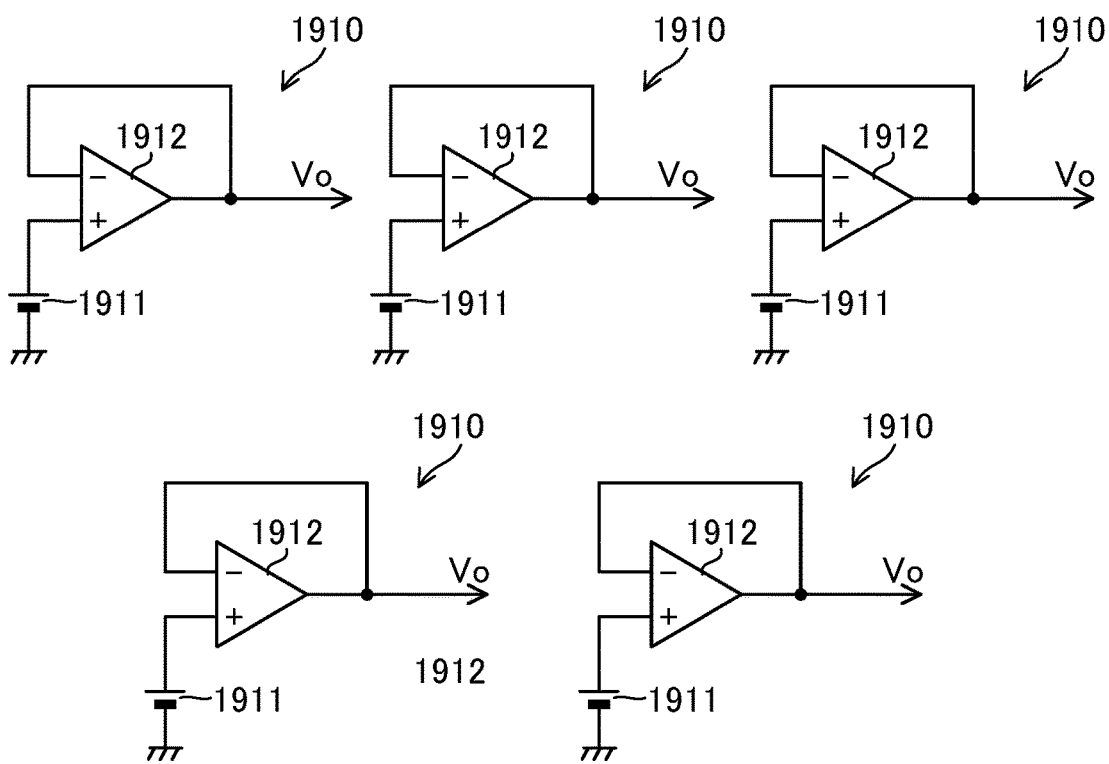
FIG. 15B is a diagram showing a scheme for coping with an output voltage of a constant voltage source being required at a plurality of places according to the second embodiment of the present disclosure.

In a case where a constant voltage source is needed in each of a plurality of circuits within a given semiconductor integrated circuit, then it is necessary either, as shown in FIG. 15A, to lay a conductor fed with the output voltage Vo of the buffer amplifier 1912 around to every place where it is required or, as shown in FIG. 15B, to arrange a constant voltage source 1910 at every place where the output voltage Vo is required.

Inconveniently, with the scheme in FIG. 15A, consideration needs to be given to the effect of cross talk and noise in laying around the conductor, and the effect may be so powerful as to make doing so unfeasible. On the other hand, with the scheme in FIG. 15B, each constant voltage source 1910 requires a reference voltage source 1911 configured with a band gap reference or the like, and this leads to an increased circuit area.

A technology to form a constant voltage source with a simple configuration would be advantageous because it would permit a constant voltage source to be formed in a small area at a place where it is required. While the above description discusses circumstances associated with constant voltage sources, similar circumstances surround constant current sources and comparators. Thus, a technology to form a constant current source or comparator with a simple configuration would be advantageous because it would permit a constant current source or comparator to be formed in a small area.

The second embodiment includes practical examples EX2_1 to EX2_3 described below. EX2_1 to EX2_3 are directed to describing technologies that contribute to simplified configurations.

Practical Example EX2_1

Figure 16:
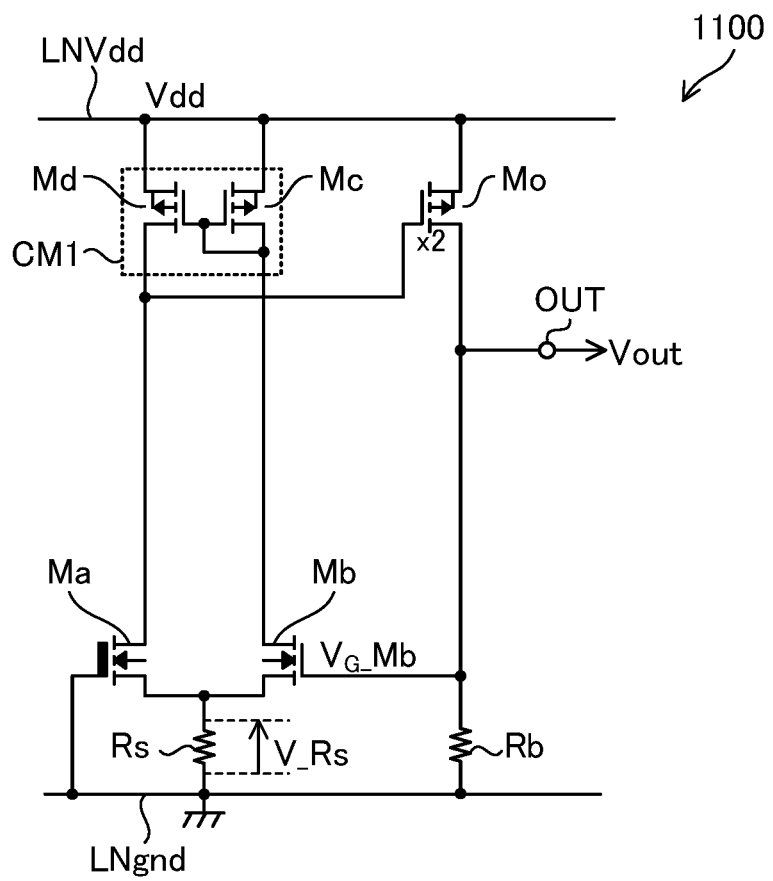
FIG. 16 is a diagram showing a circuit configuration of a constant voltage source according to Practical Example EX2_1 belonging to the second embodiment of the present disclosure.

Practical Example EX2_1 will be described. FIG. 16 is a circuit diagram of a constant voltage source 1100 according to Practical Example EX2_1. The constant voltage source 1100 includes transistors Ma and Mb (a first and a second differential transistor), transistors Mc and Md that constitute a current mirror circuit CM1, an output transistor Mo, and resistors Rs and Rb. The constant voltage source 1100 may be configured as a semiconductor integrated circuit.

The transistors Ma and Mb are N-channel MOSFETs, and their gates are connected together. That is, the transistors Ma and Mb constitute a differential pair with their gates connected together. What is particular here is that the transistors Ma and Mb have different gate threshold voltages. Specifically, the transistor Ma is a depression MOSFET, and has a negative gate threshold voltage; the transistor Mb is an enhancement MOSFET, and has a positive gate threshold voltage.

Owing to the transistor Ma having a negative gate threshold voltage, even when the gate potential of the transistor Ma is lower than the source potential of the transistor Ma, if the gate potential of the transistor Ma (e.g., −0.3 V) relative to the source potential of the transistor Ma is higher than the gate threshold voltage (e.g., −0.5 V) of the transistor Ma, the transistor Ma is on.

The transistors Mc and Md and the output transistor Mo are P-channel MOSFETs. The sources of the transistors Mc, Md, and Mo are connected to a supply voltage line LNVdd to which a predetermined positive supply voltage Vdd is applied. The gates of the transistors Mc and Md, the drain of the transistor Mc, and the drain of the transistor Mb are connected together. The drain of the transistor Md, the drain of the transistor Ma, and the gate of the output transistor Mo are connected together. The sources of the transistors Ma and Mb are connected via the resistor Rs to a ground (specifically, to a ground line LNgnd at a ground potential). While the gate of the transistor Mb is connected via the resistor Rb to the ground (i.e., to the ground line LNgnd), the gate of the transistor Ma is connected directly to the ground (i.e., to the ground line LNgnd). The drain of the output transistor Mo is connected to the gate of the transistor Mb.

It can be understood that the transistor Mc functions as the current-input side transistor in the current mirror circuit CM1, and that the transistor Md functions as the current-output side transistor in the current mirror circuit CM1. Here, the transistors Mc and Md are a pair of transistors that have the same structure and the same electrical characteristics. Thus, the current mirror circuit CM1 operates such that through the transistor Md passes a drain current with the same current value as the drain current of the transistor Mc. Here, while the drain current of the transistor Mc is output toward the transistor Mb, the drain current of the transistor Md is output toward the transistor Ma. That is, the current mirror circuit CM1 operates such that even currents are output (i.e., currents with the same current values are output) toward the drains of the transistors Ma and Mb. It should here be note that the terms "even" and "same" are to be understood to allow for errors (this applies to any other practical examples described later). Here, for transistors, their structure is to be understood to cover their size; accordingly, for a plurality of given transistors, their having the same structure means that they are the same size (this applies to any other practical examples described later).

The drain of the output transistor Mo is connected to the output terminal OUT of the constant voltage source 1100, and the output voltage Vout of the constant voltage source 1100 appears at the output terminal OUT. The constant voltage source 1100 can supply, via the output transistor Mo and the output terminal OUT, a current to a load (not illustrated) of the constant voltage source 1100 (i.e., to a load that receives the output voltage Vout). In the example in FIG. 16, used to form the output transistor Mo are two basic MOSFETs that have the same structure as the transistor Mc or Mb; those two basic MOSFETs are combined into a parallel circuit that constitutes the output transistor Mo.

Figure 17:
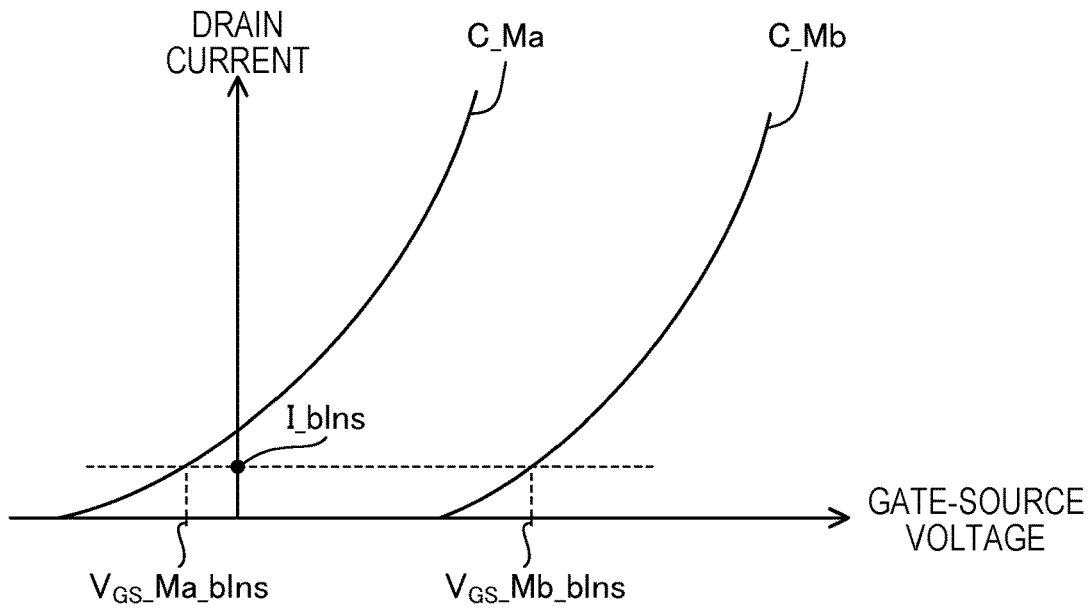
FIG. 17 is a diagram showing the characteristics of two transistors constituting a differential pair according to Practical Example EX2_1 belonging to the second embodiment of the present disclosure.

In FIG. 17, the waveform C_Ma represents the relationship of the gate-source voltage with the drain current in the transistor Ma, and the waveform C_Mb represents the relationship of the gate-source voltage with the drain current in the transistor Mb.

With the configuration described above, the circuit achieves a balance in a state where the drain currents of the transistors Ma and Mb have the same values. In a state where the drain currents of the transistors Ma and Mb have the same values, due to differences in electrical characteristics between the transistors Ma and Mb, the gate voltage $V_G$_Mb of the transistor Mb is higher than the gate voltage of the transistor Ma. In FIG. 17, the current value I_bIns is the value of the drain currents of the transistors Ma and Mb in the balanced state mentioned above. The voltage $V_{GS}$_Ma_bIns is the gate-source voltage of the transistor Ma as observed when a drain current with the current value I_bIns passes through the transistor Ma, and the voltage $V_{GS}$_Mb_bIns is the gate-source voltage of the transistor Mb as observed when a drain current with the current value I_bins passes through the transistor Mb.

While the gate voltage of the transistor Ma is zero, the gate voltage $V_G$_Mb of the transistor Mb is the sum of the gate-source voltage of the transistor Mb and the voltage drop V_Rs across the resistor Rs.

The sum voltage (V_Rs+$V_{GS}$_Mb_bIns) of the voltage drop V_Rs and the voltage $V_{GS}$_Mb_bIns is referred to as the balance gate voltage. The balance gate voltage has a positive voltage value in accordance with the electrical characteristics of the transistors Ma and Mb. The gate voltage of the output transistor Mo is adjusted by the transistors Ma to Md such that the gate voltage $V_G$_Mb of the transistor Mb is equal to the balance gate voltage, and thus the output voltage Vout is stabilized at the balance gate voltage (is substantially equal to the balance gate voltage). That is, the output voltage Vout is generated in accordance with the balance gate voltage.

With the scheme of this practical example, it is possible to form a constant voltage source with a simple configuration (hence with a small area). While the configuration employed in this practical example does not provide very high accuracy with respect to the output voltage Vout. Even so, seeing that constant voltage sources have many uses that do not require high voltage accuracy, and for such uses the configuration employed in this practical example are particularly suitable.

The constant voltage source 1100 includes a voltage output circuit that generates the output voltage Vout according to the gate voltage ($V_G$_Mb) of the transistor Mb based on the drain voltage of the transistor Ma. In the configuration in FIG. 16, the voltage output circuit is configured to include the output transistor Mo. As a result of a predetermined direct-current voltage (Vdd) being applied to the serial circuit of the output transistor Mo and the resistor Rb, through the output transistor Mo the output voltage Vout is generated.

Figure 18:
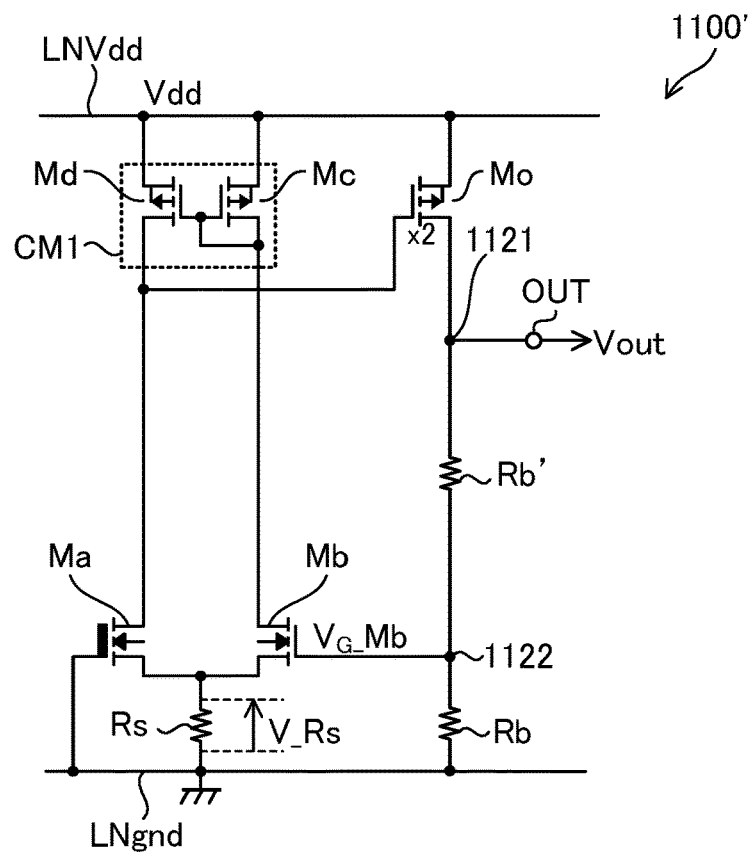
FIG. 18 is a diagram showing a modified circuit configuration of a constant voltage source according to Practical Example EX2_1 belonging to the second embodiment of the present disclosure.

In the configuration in FIG. 16, the output voltage Vout has the same voltage value as the gate voltage $V_G$_Mb of the transistor Mb. Instead, the constant voltage source 1100 may be modified such that the output voltage Vout differs from the gate voltage $V_G\_Mb$. For example, the constant voltage source 1100 in FIG. 16 may be modified into the constant voltage source 1100' in FIG. 18. In the constant voltage source 1100' in FIG. 18, a resistor Rb' is inserted between the connection node 1121 between the drain of the output transistor Mo and the output terminal OUT and the connection node 1122 between the gate of the transistor Mb and the resistor Rb. Except for the inserted resistor Rb', the constant voltage sources 1100 and 1100' share a common configuration. With the resistor Rb' so inserted, a predetermined direct-current voltage (Vdd) is applied to the series circuit of the output transistor Mo, the resistor Rb', and the resistor Rb, and thus the output voltage Vout is stabilized at the voltage determined by the gate voltage $V_G\_Mb$ and the resistance value ratio between the resistors Rb and Rb'.

Provided that the transistors Ma and Mb have different gate threshold voltages, the transistors Ma and Mb may both be enhancement MOSFETs (the same applies to any other practical examples described later). Note that, in that case, the gate of the transistor Ma needs to be fed with a positive bias. While the above description deals with a configuration where the resistor Rs is inserted between the sources of the transistors Ma and Mb and the ground, instead of the resistor Rs an active load may be inserted between the sources of the transistors Ma and Mb and the ground (the same applies to any other practical examples described later).

Practical Example EX2_2

Figure 19:
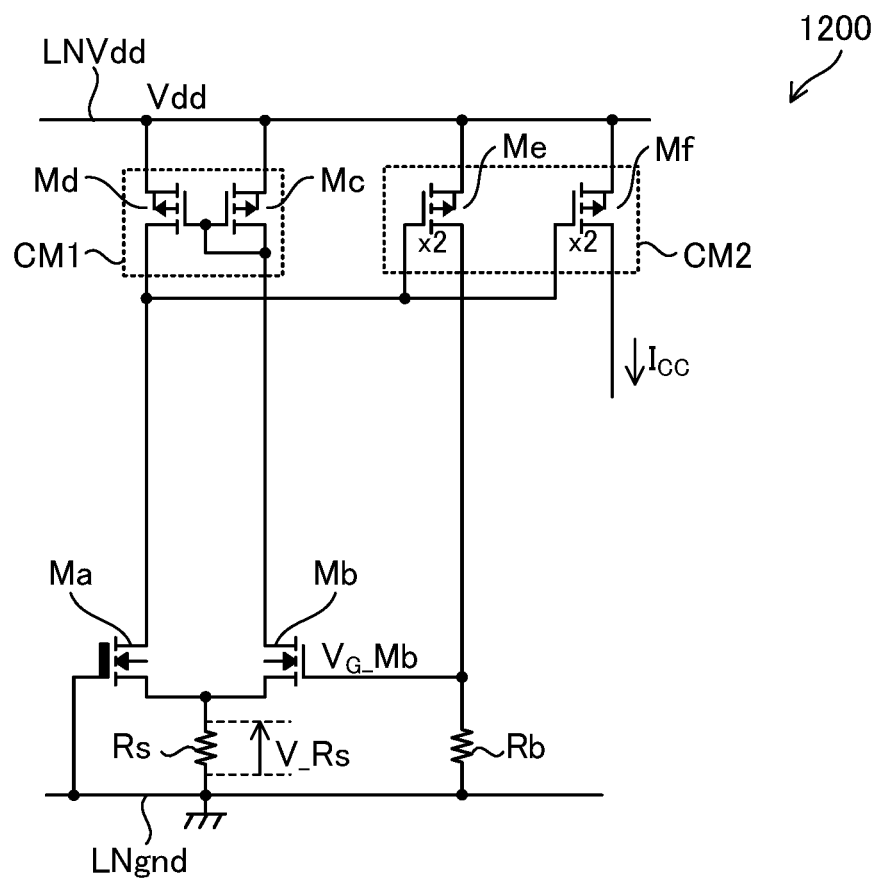
FIG. 19 is a diagram showing a circuit configuration of a constant current source according to Practical Example EX2_2 belonging to the second embodiment of the present disclosure.

Practical Example EX2_2 will be described. The configuration presented in Practical Example EX2_1 can be applied to build a constant current source. FIG. 19 is a circuit diagram of a constant current source 1200 according to Practical Example EX2_2. The constant current source 1200 includes transistors Ma and Mb (a first and a second differential transistor), transistors Mc and Md that constitute a current mirror circuit CM1, transistors Me and Mf that constitute a current mirror circuit CM2, and resistors Rs and Rb. The constant voltage source 1200 may be configured as a semiconductor integrated circuit.

In the constant current source 1200, the transistors Ma, Mb, Mc, and Md and the resistors Rs and Rb are the same as those in Practical Example EX2_1, and the interconnections among them are as in Practical Example EX2_1. That is, the sources of the transistors Mc and Md are connected to the supply voltage line LNVdd to which a predetermined positive supply voltage Vdd is applied. The gates of the transistors Mc and Md, the drain of the transistor Mc, and the drain of the transistor Mb are connected together. The drains of the transistors Ma and Md are connected together. The sources of the transistors Ma and Mb are connected via the resistor Rs to the ground (specifically, to the ground line LNgnd at the ground potential). The gate of the transistor Mb is connected via the resistor Rb to the ground (i.e., to the ground line LNgnd), and the gate of the transistor Ma is connected directly to the ground (i.e., to the ground line LNgnd).

The current mirror circuit CM1 operates such that through the transistor Md passes a drain current with the same current value as the drain current of the transistor Mc. Here, the drain current of the transistor Mc is output toward the transistor Mb, and the drain current of the transistor Md is output toward the transistor Ma. That is, the current mirror circuit CM1 operates such that even currents are output (i.e., currents with the same current values are output) toward the drains of the transistors Ma and Mb.

The transistors Me and Mf are P-channel MOSFETs. The sources of the transistors Me and Mf are connected to the supply voltage line LNVdd, and the gates of the transistors Me and Mf are connected to the drain of the transistor Ma. The drain of the transistor Me is connected to the gate of the transistor Mb.

It can be understood that the transistor Me functions as the current-input side transistor in the current mirror circuit CM2, and that the transistor Mf functions as the current-output side transistor in the current mirror circuit CM2. Here, the transistors Me and Mf are a pair of transistors that have the same structure and the same electrical characteristics. Thus, through the transistor Mf passes a drain current with the same current value as the drain current of the transistor Me (assuming that a load not illustrated in FIG. 19 is connected to the drain of the transistor Mf). In the example in FIG. 19, used to form the output transistor Me are two basic MOSFETs that have the same structure as the transistor Mc or Mb; those two basic MOSFETs are combined into a parallel circuit that constitutes the transistor Me. A similar description applies to the transistor Mf.

With the configuration in FIG. 19, as with the configuration in FIG. 16, the circuit achieves a balance in a state where the drain currents of the transistors Ma and Mb have the same current value. Accordingly, as described in connection with Practical Example EX2_1, the gate voltages of the transistors Me and Mf are adjusted by the transistors Ma to Md such that the gate voltage $V_G\_Mb$ of the transistor Mb is equal to the balance gate voltage mentioned above. As a result, a drain current with a current value equal to the balance gate voltage divided by the value of the resistor Rb passes through the transistor Me, and a constant current $I_{CC}$ with the same current value as that drain current passes through the transistor Mf as its drain current (assuming that a load not illustrated in FIG. 19 is connected to the transistor Mf).

In the constant current source 1200 in FIG. 19, the predetermined direct-current voltage (Vdd) is applied to the series circuit of the transistor Me and the resistor Rb. Instead, another resistor (not illustrated) may be inserted between the drain of the transistor Me and the connection node between the gate of the transistor Mb and the resistor Rb.

The value of the constant current $I_{CC}$ may be adjusted by adjusting the ratio between the number of basic MOSFETs constituting the transistor Me and the number of basic MOSFETs constituting the transistor Mf.

The current mirror circuit CM2 may be additionally provided with one or more other transistors (not illustrated) with the same structure and the same electrical characteristics as the transistor Me or Mf and the gates of the transistor Me or Mf and the gates of those one or more other transistors may be connected together. Then, the constant current can be obtained also from the drains of those one or more other transistors.

With the scheme of this practical example it is possible to build a constant current source with a simple configuration (hence with a small area).

For example, the constant current source 1200 according to Practical Example EX2_2 may be used to form at least one of the constant current circuits $CC_{IG}$ and $CC_{OTPG}$ (see FIG. 6) described in connection with the first embodiment. In such cases, if the constant current source 1200 is used to form the constant current circuit $CC_{IG}$, the constant current $I_{CC}$ functions as the constant current IG (see FIG. 6); if the constant current source 1200 is used to form the constant current circuit $CC_{OTPG}$, the constant current $I_{CC}$ functions as the constant current OTPG (see FIG. 6). In a case where the second embodiment (in particular Practical Example EX2_2) is combined with the first embodiment, the supply voltage line LNVdd and $LN_{VDD}$ are to be understood to refer to the same entity (hence Vdd=VDD) and the ground line LNgnd and $LN_{GND}$ are to be understood to refer to the same entity (see FIGS. 6 and 19).

Figure 20:
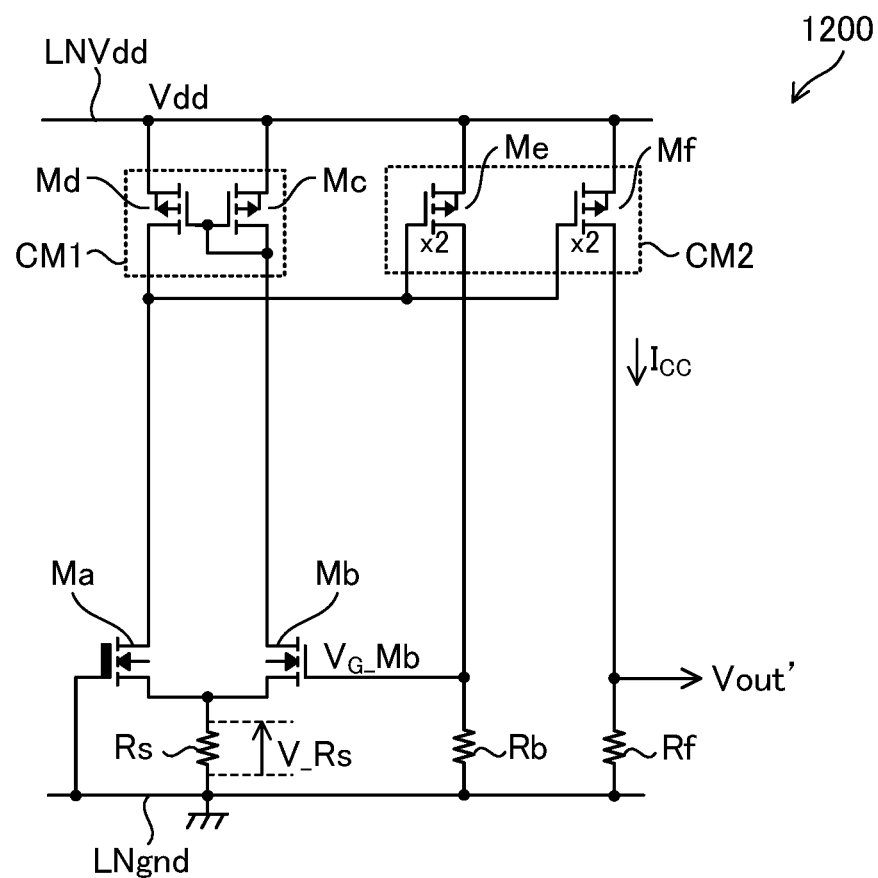
FIG. 20 is a diagram showing a modification technology for the circuit configuration shown in FIG. 19 according to Practical Example EX2_2 belonging to the second embodiment of the present disclosure.

As shown in FIG. 20, a configuration is possible where the drain of the transistor Mf in the constant current source 1200 is connected via a resistor Rf to the ground. In the configuration in FIG. 20, an output voltage Vout' with a voltage value determined by the values of the resistor Rf and the constant current $I_{CC}$ appears across the resistor Rf That is, the configuration in FIG. 20 functions as a constant voltage source. In that case, giving the resistors Rb and Rf the same value permits a voltage that duplicates the gate voltage $V_G$_Mb of the transistor Mb (i.e., the balance gate voltage) to be obtained as the output voltage Vout'.

Practical Example EX2_3

Figure 21:
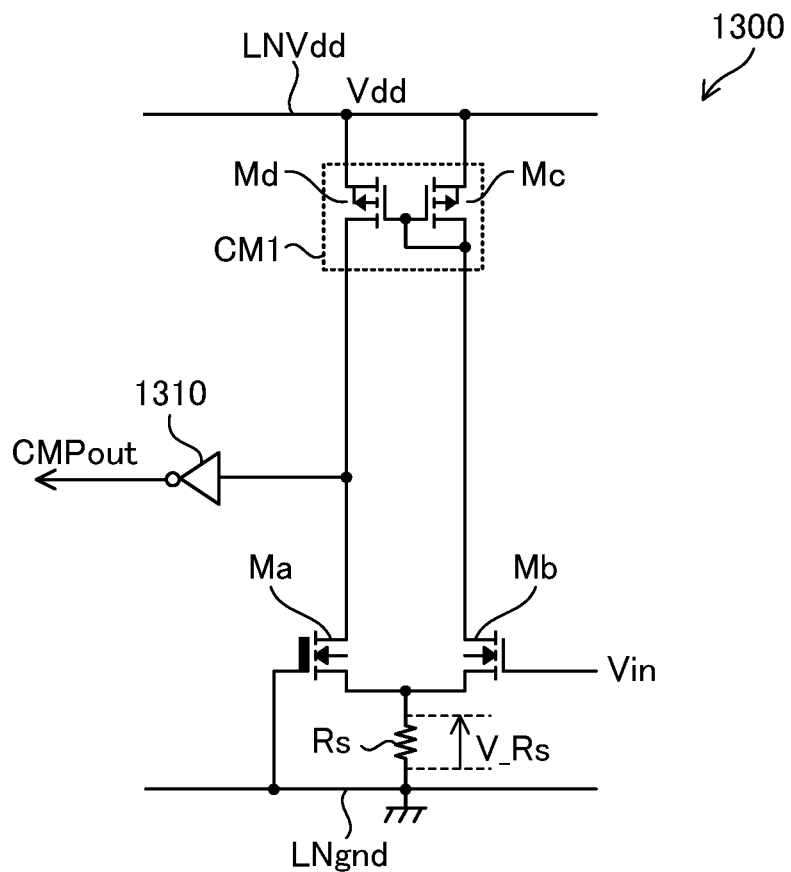
FIG. 21 is a diagram showing a circuit configuration of a comparator according to Practical Example EX2_3 belonging to the second embodiment of the present disclosure.
Figure 22:
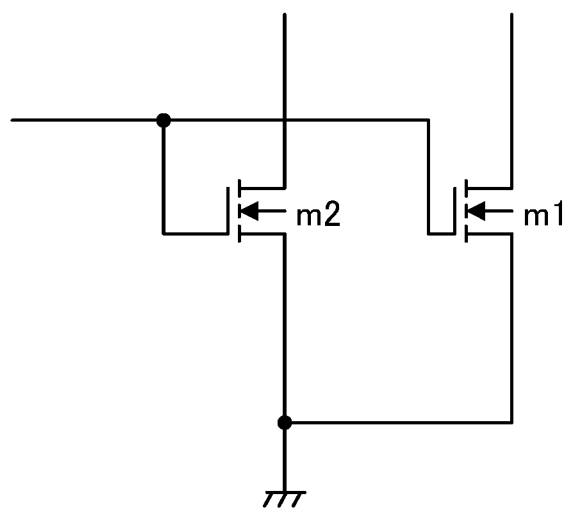
FIG. 22 is a diagram showing a principal part of a non-volatile memory according to a reference configuration.

Practical Example EX2_3 will be described. The configuration presented in the Practical Example EX2_1 can be applied to form a comparator. FIG. 21 is a circuit diagram of a comparator 1300 according to Practical Example EX2_3. The comparator 1300 includes transistors Ma and Mb (a first and a second differential transistor), transistors Mc and Md that constitute a current mirror circuit CM1, a resistor Rs, and an output circuit 1310. The comparator 1300 may be configured as a semiconductor integrated circuit.

In the comparator 1300, the transistors Ma, Mb, Mc, and Md and the resistor Rs are the same as those in Practical Example EX2_1, and the interconnections among them are as in Practical Example EX2_1. That is, the sources of the transistors Mc and Md are connected to the supply voltage line LNVdd to which a predetermined positive supply voltage Vdd is applied. The gates of the transistors Mc and Md, the drain of the transistor Mc, and the drain of the transistor Mb are connected together. The drains of the transistors Ma and Md are connected together. The sources of the transistors Ma and Mb are connected via the resistor Rs to the ground (specifically, to the ground line LNgnd at the ground potential). The gate of the transistor Ma is connected directly to the ground (i.e., to the ground line LNgnd).

The current mirror circuit CM1 operates such that through the transistor Md passes a drain current with the same current value as the drain current of the transistor Mc. Here, the drain current of the transistor Mc is output toward the transistor Mb, and the drain current of the transistor Md is output toward the transistor Ma. That is, the current mirror circuit CM1 operates such that even currents are output (i.e., currents with the same current values are output) toward the drains of the transistors Ma and Mb. Note however that whether even currents are actually output depends on an input voltage Vin.

In the comparator 1300 in FIG. 21, the output circuit 1310 is configured with an inverter. Thus, the output circuit 1310 may be referred to as the inverter 1310. The input terminal of the inverter 1310 is connected to the drain of the transistor Ma, and the inverter 1310 outputs from its output terminal a signal CMPout. The inverter 1310 outputs from its output terminal the inversion signal of the input signal that is fed to its input terminal. Specifically, the inverter 1310, when the input voltage to its input terminal is lower than a predetermined threshold voltage, outputs from its output terminal a high-level signal and, when the input voltage to its input terminal is equal the or than a predetermined threshold voltage, outputs from its output terminal a low-level signal. The inverter 1310 operates based on the supply voltage Vdd, and the threshold voltage of the inverter 1310 is approximately one-half of the supply voltage Vdd. The threshold voltage of the inverter 1310 may be given hysteresis.

In the comparator 1300, the gate of the transistor Mb is fed with the voltage Vin. The voltage Vin is the input voltage to the comparator 1300, and the comparator 1300 outputs a signal CMPout that indicates the magnitude relationship between the input voltage Vin and a predetermined voltage. The predetermined voltage here is the balance gate voltage mentioned above, which depends on the electrical characteristics of the transistors Ma and Mb.

With reference to a state where the input voltage Vin is equal to the balance gate voltage, as the input voltage Vin falls below the balance gate voltage, the drain voltage of the transistor Ma falls and when it falls below the threshold voltage of the inverter 1310, the signal CMPout turns to high level; by contrast, as the input voltage Vin rises above the balance gate voltage, the drain voltage of the transistor Ma rises and when it rises above the threshold voltage of the inverter 1310, the signal CMPout turns to low level. Thus, the signal CMPout indicates the magnitude relationship between the input voltage Vin and the predetermined voltage (balance gate voltage)

With the scheme of this practical example, it is possible to form a comparator with a simple configuration (hence with a small area).

The output circuit 1310 may be any circuit (e.g., buffer circuit) other than an inverter. The output circuit 1310 may be any circuit that can output a signal with a first level based on a fall in the drain voltage of the transistor Ma in response to the input voltage Vin being lower than the balance gate voltage and that can output a signal with a second level based on a rise in the drain voltage of the transistor Ma in response to the input voltage Vin being higher than the balance gate voltage (where the first and second levels differ).

[Notes 1]

To follow are supplementary notes on what is disclosed herein of which specific configuration examples have been described above by way of embodiments.

According to one aspect of the present disclosure, a non-volatile memory includes: a first transistor; a second transistor having its gate connected to the gate of the first transistor; a resistor having a first terminal and a second terminal, with the first terminal connected to the source of the first transistor; a read voltage feed circuit configured to feed a read voltage for turning on at least one of the first and second transistors to between the gate of the first transistor and the second terminal of the resistor and to between the gate and the source of the second transistor; and a signal output circuit configured to output, in a read operation in which the read voltage feed circuit feeds the read voltage, a signal associated with a first value or a signal associated with a second value based on the drain currents of the first and second transistors. (A first configuration.)

In the non-volatile memory of the first configuration described above, in the read operation, the signal output circuit may output the signal associated with the first value if the drain current of the second transistor is higher than the drain current of the first transistor and output the signal associated with the second value if the drain current of the first transistor is higher than the drain current of the second transistor. (A second configuration.)

In the non-volatile memory of the second configuration described above, there may be further provided a program circuit configured to perform a program operation to increase the gate threshold voltage of the second transistor by injecting hot carriers into the second transistor. (A third configuration.)

In the non-volatile memory of the third configuration described above, in the read operation performed before the program operation, the drain current of the second transistor may be higher than the drain current of the first transistor and, in the read operation performed after the program operation, with the gate threshold voltage of the second transistor having been increased in the program operation, the drain current of the first transistor may be higher than the drain current of the second transistor. (A fourth configuration.)

In the non-volatile memory of the third or fourth configuration described above, the first and second transistors may have the same structure and, before the program operation, the first and second transistors may have the same gate threshold voltage. (A fifth configuration.)

According to another aspect of the present disclosure, a non-volatile memory includes: a first transistor; a second transistor having its gate connected to the gate of the first transistor; a resistor having a first terminal and a second terminal, with the first terminal connected to the source of the first transistor; a read voltage feed circuit configured to be able to feed a read voltage for turning on at least one of the first and second transistors; and a signal output circuit configured to be able to output, in a read operation in which the read voltage feed circuit feeds the read voltage, a signal associated with a first value or a signal associated with a second value based on the drain currents of the first and second transistors. (A sixth configuration.)

In the non-volatile memory of the sixth configuration described above, when the read operation is performed, the signal output circuit may be able to output the signal associated with the first value if the drain current of the second transistor is higher than the drain current of the first transistor and may be able to output the signal associated with the second value if the drain current of the first transistor is higher than the drain current of the second transistor. (A seventh configuration.)

In the non-volatile memory of the seventh configuration described above, there may be further provided a program circuit configured to be able to perform a program operation to increase the gate threshold voltage of the second transistor by injecting hot carriers into the second transistor. (An eighth configuration.)

In the non-volatile memory of the eighth configuration described above, when the read operation is performed before the program operation, in the read operation, the drain current of the second transistor may be higher than the drain current of the first transistor and, when the read operation is performed after the program operation, in the read operation, with the gate threshold voltage of the second transistor having been increased in the program operation, the drain current of the first transistor may be higher than the drain current of the second transistor. (A ninth configuration.)

In the non-volatile memory of the eighth or ninth configuration described above, the first and second transistors may have the same structure and, before the program operation, the first and second transistors may have the same gate threshold voltage. (A tenth configuration.)

[Notes 2]

To follow are supplementary notes on constant voltage sources and the like according to the present disclosure of which specific configuration examples have been described in connection with the second embodiment.

According to one aspect of the present disclosure, a constant voltage source (see FIG. 16) includes: a differential pair composed of a first differential transistor (Ma) and a second differential transistor (Mb) that have their sources connected together and that have different gate threshold voltages; a drain-side circuit (CM1) that is connected to the drains of the first and second differential transistors and that outputs currents toward the drains of the first and second differential transistors; and a voltage output circuit (Mo) that generates an output voltage (Vout) commensurate with the gate voltage of the second differential transistor based on the drain voltage of the first differential transistor. This configuration is identified as $W_{B1}$.

In the constant voltage source of configuration $W_{B1}$, the first differential transistor may be a depression MOSFET, the second differential transistor may be an enhancement MOSFET, the gate of the first differential transistor may be connected directly to the ground, and the gate of the second differential transistor may be connected via a resistor (Rb) to the ground. This configuration is identified as $W_{B2}$.

In the constant voltage source of configuration $W_{B2}$, the voltage output circuit may include an output transistor (Mo) that receives as its gate voltage the drain voltage of the first differential transistor, a predetermined direct-current voltage (Vdd) may be applied to a series circuit including the output transistor and the resistor, and the output voltage may be generated through the output transistor. This configuration is identified as $W_{B3}$.

In the constant voltage source of any of configurations $W_{B1}$ to $W_{B3}$, the drain-side circuit may be a drain-side current mirror circuit (CM1) that operates to output even currents toward the drains of the first and second differential transistors. This configuration is identified as $W_{B4}$.

According to another aspect of the present disclosure, a constant current source (see FIG. 19) includes: a differential pair composed of a first differential transistor (Ma) and a second differential transistor (Mb) that have their sources connected together and that have different gate threshold voltages; and a drain-side circuit (CM1) that is connected to the drains of the first and second differential transistors and that outputs currents toward the drains of the first and second differential transistors. Based on the drain voltage of the first differential transistor and the gate voltage of the second differential transistor, a constant current ($I_{CC}$) is generated. This configuration is identified as $W_{C1}$.

In the constant current source of configuration $W_{C1}$, the first differential transistor may be a depression MOSFET, the second differential transistor may be an enhancement MOSFET, the gate of the first differential transistor may be connected directly to the ground, and the gate of the second differential transistor may be connected via a resistor to the ground. This configuration is identified as $W_{C2}$.

In the constant current source of configuration $W_{C2}$, there may be provided a current mirror circuit (CM2) composed of a plurality of transistors that receive as their gate voltage the drain voltage of the first differential transistor, the plurality of transistors may include a first mirror transistor (Me) and a second mirror transistor (Mf, a predetermined direct-current voltage (Vdd) may be applied to a series circuit including the first mirror transistor and the resistor, and the constant current is output through the second mirror transistor. This configuration is identified as $W_{C3}$.

In the constant current source of any of configurations $W_{C1}$ to $W_{C3}$, the drain-side circuit may be a drain-side current mirror circuit (CM1) that operates to output even currents toward the drains of the first and second differential transistors. This configuration is identified as $W_{C4}$.

According to yet another aspect of the present disclosure, a comparator (see FIG. 21) includes: a differential pair composed of a first differential transistor (Ma) and a second differential transistor (Mb) that have their sources connected together and that have different gate threshold voltages; and a drain-side circuit (CM1) that is connected to the drains of the first and second differential transistors and that outputs currents toward the drains of the first and second differential transistors. An input voltage (Vin) is received at the gate of the second differential transistor, and a signal (CMPout) that indicates the magnitude relationship between the input voltage and a predetermined voltage is output. This configuration is identified as $W_{D1}$.

In the comparator of configuration $W_{D1}$, the first differential transistor may be a depression MOSFET, the second differential transistor may be an enhancement MOSFET, and the gate of the first differential transistor may be connected to the ground. This configuration is identified as $W_{D2}$.

In the comparator of configuration $W_{D2}$, the predetermined voltage may depend on the electrical characteristics of the differential transistors, and the signal that indicates the magnitude relationship between the input voltage and the predetermined voltage may be output according to the drain voltage of the first differential transistor. This configuration is identified as $W_{D3}$.

In the comparator of any of configurations $W_{D1}$ to $W_{D3}$, the drain-side circuit may be a drain-side current mirror circuit (CM1) that operates to output even currents toward the drains of the first and second differential transistors. This configuration is identified as $W_{D4}$.

Modifications

Embodiments of the present disclosure can be modified in many ways as necessary without departure from the scope of the technical concepts defined in the appended claims. The embodiments described herein are merely examples of how the present disclosure can be implemented, and what is meant by any of the terms used to describe the present disclosure and its constituent elements is not limited to that mentioned in connection with the embodiments. The specific values mentioned in the above description are merely illustrative and needless to say can be modified to different values.

For any signal or voltage, the relationship between its high and low levels may be reversed so long as that can be done without departure from what has been described above.

The channel type of any of the FETs (field-effect transistors) presented in the embodiments is merely illustrative: any circuit including FETs may be modified such that any N-channel FET is replaced with a P-channel FET or that any P-channel FET is replaced with an N-channel FET.

Unless any inconvenience arises, any of the transistors mentioned above may be of any type. For example, unless any inconvenience arises, any transistor mentioned above as a MOSFET may be replaced with a junction FET, an IGBT (insulated-gate bipolar transistor), or a bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

The invention claimed is:
1. A non-volatile memory, comprising:
a first transistor;
a second transistor having a gate connected to a gate of the first transistor;
a resistor having a first terminal and a second terminal, the first terminal being connected to a source of the first transistor;
a read voltage feed circuit configured to feed a read voltage for turning on at least one of the first and second transistors to between the gate of the first transistor and the second terminal of the resistor and to between the gate and a source of the second transistor; and
a signal output circuit configured to output, in a read operation in which the read voltage feed circuit feeds the read voltage, a signal associated with a first value or a signal associated with a second value based on drain currents of the first and second transistors.

2. The non-volatile memory according to claim 1, wherein
in the read operation, the signal output circuit
outputs the signal associated with the first value if the drain current of the second transistor is higher than the drain current of the first transistor and
outputs the signal associated with the second value if the drain current of the first transistor is higher than the drain current of the second transistor.

3. The non-volatile memory according to claim 2, further comprising a program circuit configured to perform a program operation to increase a gate threshold voltage of the second transistor by injecting hot carriers into the second transistor.

4. The non-volatile memory according to claim 3, wherein,
in the read operation performed before the program operation, the drain current of the second transistor is higher than the drain current of the first transistor and,
in the read operation performed after the program operation, with the gate threshold voltage of the second transistor having been increased in the program operation, the drain current of the first transistor is higher than the drain current of the second transistor.

5. The non-volatile memory according to claim 3, wherein the first and second transistors have a same structure, and before the program operation, the first and second transistors have a same gate threshold voltage.

6. A non-volatile memory, comprising:
a first transistor;
a second transistor having a gate connected to a gate of the first transistor;
a resistor having a first terminal and a second terminal, the first terminal being connected to a source of the first transistor;
a read voltage feed circuit configured to be able to feed a read voltage for turning on at least one of the first and second transistors; and
a signal output circuit configured to be able to output, in a read operation in which the read voltage feed circuit feeds the read voltage, a signal associated with a first value or a signal associated with a second value based on drain currents of the first and second transistors.

7. The non-volatile memory according to claim 6, wherein when the read operation is performed, the signal output circuit
- can output the signal associated with the first value if the drain current of the second transistor is higher than the drain current of the first transistor and
- can output the signal associated with the second value if the drain current of the first transistor is higher than the drain current of the second transistor.

8. The non-volatile memory according to claim 7, further comprising a program circuit configured to be able to perform a program operation to increase a gate threshold voltage of the second transistor by injecting hot carriers into the second transistor.

9. The non-volatile memory according to claim 8, wherein,
- when the read operation is performed before the program operation, in the read operation, the drain current of the second transistor is higher than the drain current of the first transistor and
- when the read operation is performed after the program operation, in the read operation, with the gate threshold voltage of the second transistor having been increased in the program operation, the drain current of the first transistor is higher than the drain current of the second transistor.

10. The non-volatile memory according to claim 8, wherein
- the first and second transistors have a same structure, and
- before the program operation, the first and second transistors have a same gate threshold voltage.

* * * * *